(12) United States Patent
Cheng et al.

(10) Patent No.: US 12,374,616 B2
(45) Date of Patent: Jul. 29, 2025

(54) SEMICONDUCTOR DEVICE AND METHOD FOR MANUFACTURING THE SAME

(71) Applicant: Taiwan Semiconductor Manufacturing Company, Ltd., Hsinchu (TW)

(72) Inventors: Po-Hsien Cheng, Hsinchu (TW); Zhen-Cheng Wu, Taichung (TW); Tze-Liang Lee, Hsinchu (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 471 days.

(21) Appl. No.: 17/742,407

(22) Filed: May 12, 2022

(65) Prior Publication Data

US 2023/0369201 A1    Nov. 16, 2023

(51) Int. Cl.
*H01L 23/522* (2006.01)
*H01L 21/768* (2006.01)
*H01L 23/532* (2006.01)
*H10D 84/01* (2025.01)
*H10D 84/03* (2025.01)
*H10D 84/83* (2025.01)

(52) U.S. Cl.
CPC .... *H01L 23/5226* (2013.01); *H01L 21/76802* (2013.01); *H01L 21/76819* (2013.01); *H01L 21/76877* (2013.01); *H01L 23/53228* (2013.01); *H01L 23/5329* (2013.01); *H10D 84/0149* (2025.01); *H10D 84/0158* (2025.01); *H10D 84/038* (2025.01); *H10D 84/834* (2025.01)

(58) Field of Classification Search
None
See application file for complete search history.

(56) References Cited

U.S. PATENT DOCUMENTS

| | | |
|---|---|---|
| 2004/0046259 A1 | 3/2004 | Chow |
| 2005/0085083 A1 | 4/2005 | Huang |
| 2014/0141586 A1 | 5/2014 | Hu et al. |
| 2021/0358803 A1* | 11/2021 | Lee .................. H01L 21/76829 |

OTHER PUBLICATIONS

Office Action received in the corresponding Taiwan application 11221086720, mailed Oct. 31, 2023.

* cited by examiner

*Primary Examiner* — Bo B Jang
(74) *Attorney, Agent, or Firm* — KILPATRICK TOWNSEND & STOCKTON LLP

(57) ABSTRACT

A method for forming a semiconductor device includes providing a base device having a top dielectric layer, forming a sacrificial layer on the top dielectric layer, and patterning the sacrificial layer to form openings. The method also includes depositing first protective dielectric layer and a low-K dielectric layer in the opening and performing planarization to form a first planarized structure including sacrificial regions and low k regions separated by a first protective layer. Next, top portions of the low-k dielectric layer are replaced with a second protective dielectric layer to form a second planarized structure that includes enclosed dielectric structures separated by sacrificial regions. The method further includes replacing the remaining portions of the sacrificial layer with a target metal interconnect material to form a third planarized structure that includes metal interconnect material disposed between enclosed dielectric structures.

20 Claims, 17 Drawing Sheets

SEMICONDUCTOR DEVICE AND METHOD FOR MANUFACTURING THE SAME

BACKGROUND

Technological advances in semiconductor integrated circuit (IC) materials and design have produced generations of ICs with smaller and more complex circuits. Functional density has increased while geometry size has decreased. Besides providing improved circuit speed and larger integrated circuits, this scaling down process also provides benefits by increasing production efficiency and lowering costs.

The increasing complexity of ICs has led to the development of multi-level interconnect structures. The copper interconnect material is widely used in high-speed semiconductor devices because of its low resistivity. However, copper is known to diffuse through dielectric materials; so the copper interconnect structures must be encapsulated by a diffusion barrier layer. Otherwise, the diffused copper metal in the dielectric layer may result in current leakage between the interconnect structures. The diffusion barrier layer typically includes a refractory metal material, including tantalum (Ta), tantalum nitride (TaN), titanium (Ti), and titanium nitride (TiN).

The continuing scaling has also increased the complexity of manufacturing ICs, which also imposes increasingly stringent requirements on the copper interconnect structures made with copper or other materials.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A is a cross-sectional view diagram illustrating a starting stage of the method for forming a semiconductor device, in accordance with some embodiments.

FIG. 5B is a cross-sectional view diagram illustrating an intermediate stage of the method for forming a semiconductor device, in accordance with some embodiments.

FIG. 5C is a cross-sectional view diagram illustrating an intermediate stage of the method for forming a semiconductor device, in accordance with some embodiments.

FIG. 5D is a cross-sectional view diagram illustrating an intermediate stage of the method for forming a semiconductor device, in accordance with some embodiments.

FIG. 5E is a cross-sectional view diagram illustrating an intermediate stage of the method for forming a semiconductor device, in accordance with some embodiments.

FIG. 5F is a cross-sectional view diagram illustrating an intermediate stage of the method for forming a semiconductor device, in accordance with some embodiments.

FIG. 5G is a cross-sectional view diagram illustrating an intermediate stage of the method for forming a semiconductor device, in accordance with some embodiments.

FIG. 5H is a cross-sectional view diagram illustrating an intermediate stage of the method for forming a semiconductor device, in accordance with some embodiments.

FIG. 5I is a cross-sectional view diagram illustrating an intermediate stage of the method for forming a semiconductor device, in accordance with some embodiments.

FIG. 5J is a cross-sectional view diagram illustrating an intermediate stage of the method for forming a semiconductor device, in accordance with some embodiments.

FIG. 5K is a cross-sectional view diagram illustrating an intermediate stage of the method for forming a semiconductor device, in accordance with some embodiments.

FIG. 5L is a cross-sectional view diagram illustrating an intermediate stage of the method for forming a semiconductor device, in accordance with some embodiments.

DETAILED DESCRIPTION

Figure 1:
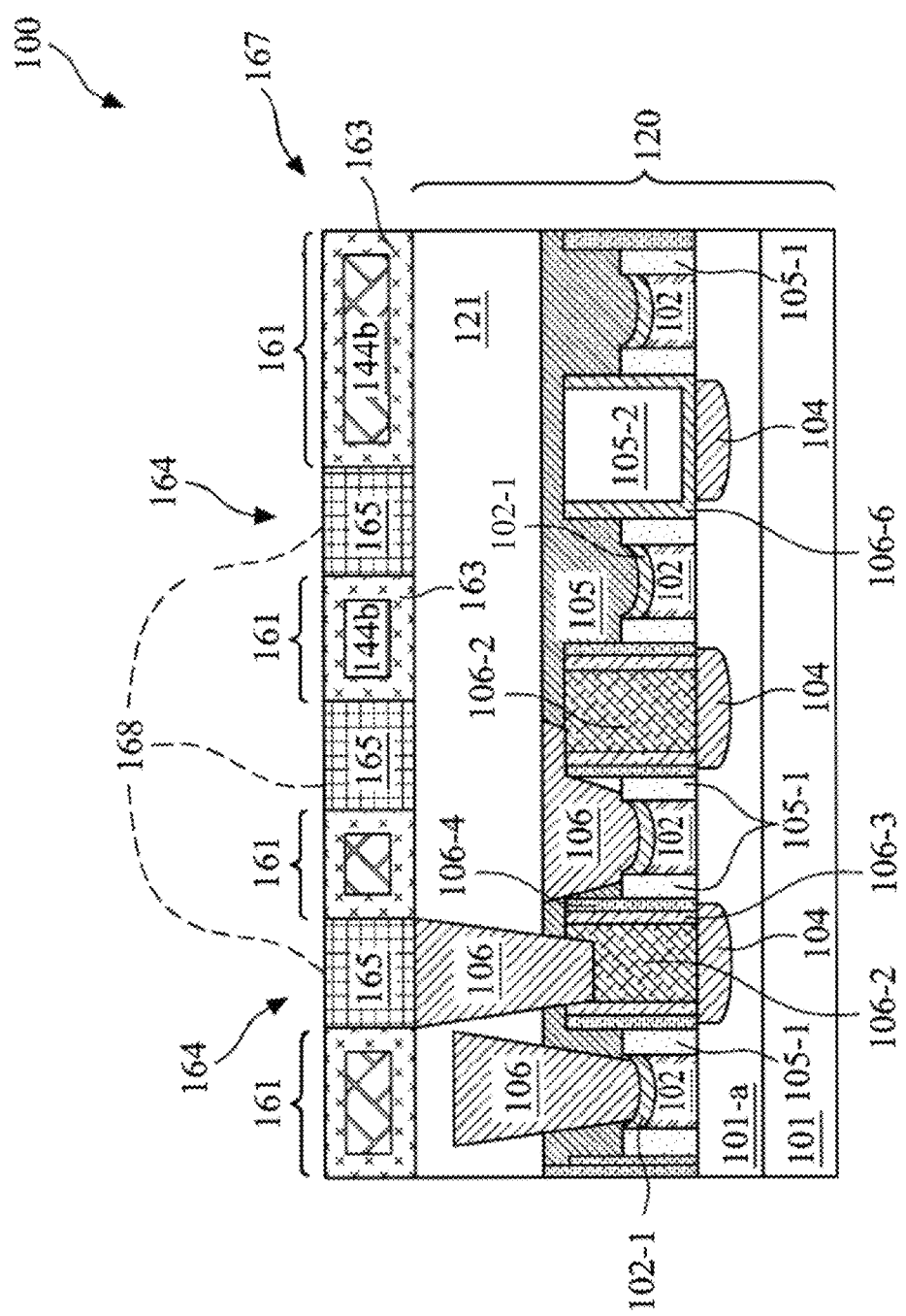
FIG. 1 is a cross-sectional view diagram illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In advanced IC technologies, copper (Cu) interconnect lines are formed in a low-k dielectric layer. A barrier metal, such as tantalum nitride (TaN), is deposited at the side-wall of the low-k dielectric layer to serve as a Cu diffusion barrier. With scaling, the metal pitch and metal line width are continuously decreasing. Part of the conductive line width is taken up by the TaN barrier metal, reducing the available space for the copper lines. In addition, barrier metals such as TaN often have a high resistivity. Therefore, conductive interconnect lines made of Cu and the TaN barrier metal process tend to have high resistivity. To make matters worse, as the metal pitch continues to shrink, the TaN thickness cannot be further reduced, due to materials and process limitations. As a result, the TaN-to-Cu thickness ratio will be increased, causing the resistivity to increase, and the performance of the device is dramatically decreased.

In some embodiments, a copper interconnect structure is provided, in which no barrier metal layers are needed between the copper line and the adjacent low-k dielectric layer. Instead, a protective dielectric layer is formed between the copper line and the low-k dielectric. The protective dielectric layer is a low-k dielectric and also has the property as a diffusion barrier for copper. The protective dielectric layer does not reduce the space reserved for the copper line, allowing the maximum available width for the copper line for the lowest resistivity. Therefore, the resistor-capacitor (RC) delay of interconnection lines is also reduced. In some embodiments, the copper lines are separated by enclosed protective dielectric structures. Each enclosed protective dielectric structure includes a low-k dielectric material enclosed on all sides by a protective dielectric enclosure. The protective dielectric enclosure includes a layer of the protective dielectric layer, which is both a low-k dielectric and a copper diffusion barrier. In this structure, the low-k dielectric is protected from etching damages, which are known to increase the dielectric constant of the low-k dielectric layer after an etching process. In some embodiments, the protective dielectric material comprises a boron nitride (BN) material.

Further, in some embodiments, a method is provided, in which a sacrificial structure is formed as a place holder for the final copper interconnect structure, and the low-k enclosed protective dielectric structure is formed between the sacrificial structures. Subsequently, the sacrificial structure is replaced by the copper to form the interconnect. In this process, the enclosed low-k dielectric layer is not subject to energetic plasma or reactive-ion etching processes. In contrast, in the related process, the low-k dielectric is subject to etching to form openings in which the copper material is deposited. The etching process is known to cause damage in the low-k dielectric layer. In addition, the method also provides higher metal line densities.

FIG. 1 is a cross-sectional view of a semiconductor device, in accordance with some embodiments. FIG. 1 illustrates a semiconductor device 100 that includes a base device structure 120 having a top dielectric layer 121 and metal contact structures 106 disposed in the top dielectric layer 121. As described below, in this example, base device structure 120 includes one or more fin-type field effect transistors (FinFET). Semiconductor device 100 also includes a patterned dielectric layer 167 on the top dielectric layer 121, the patterned dielectric layer 167 including a plurality of enclosed protective dielectric structures 161 separated by gap regions 164. Each enclosed protective dielectric structure 161 includes a low-k dielectric material 144b enclosed by a protective dielectric enclosure 163. Protective dielectric enclosure 163 includes a protective dielectric layer, which is both a low-k dielectric and a diffusion barrier. Semiconductor device 100 also includes a metal interconnect structure 168 having a metal interconnect material 165 disposed in the gap regions 164 in the patterned dielectric layer 167. The metal interconnect material 165 is in contact with enclosed protective dielectric structures 163.

As shown in FIG. 1, base device structure 120 includes a FinFET, having a substrate 101 with a fin structure 101-a, a gate structure 102 across the fin structure 101-a, a source/drain (S/D) region 104 in and/or on the fin structure 101-a. Base device structure 120 also includes a top dielectric layer 121 on the substrate 101. Metal contact structures 106 are disposed in the top dielectric layer 121 and on the gate structure 102 and the source/drain (S/D) region 104. As used herein, the term S/D region(s) may refer to a source or a drain, individually or collectively, dependent upon the context. The top dielectric layer 121 can be an interlayer dielectric layer (ILD) in a multi-level interconnect structure.

In some embodiments of the base device structure 120, gate structure 102 is a metal gate structure, with a tungsten (W) cap layer 102-1 on top and a dielectric layer 105-1, e.g., a low-k dielectric, at the sides. Further, source/drain regions 104 are in an epitaxial semiconductor layer. The metal contact structure 106 can be a tungsten plug on top of a cobalt contact 106-2, which contacts the source/drain region 104. A barrier layer, e.g., titanium nitride (TiN), 106-3, and a dielectric layer, e.g., silicon nitride (SiN), 106-4, are disposed on the side of cobalt contact 106-2. In some embodiments, a dielectric structure 105-2 is disposed on a source/drain region 104 and separated from the source/drain region 104 by a bottom contact etching stop layer (BCESL) 106-6, which can be a silicon nitride (SiN) layer. Further, a dielectric layer 105, e. g., a silicon nitride (SiN) layer, is disposed over the transistor device structures described above. Further details of the FinFET devices are described below in connection to FIGS. 2 and 3.

With further reference to FIG. 1, in semiconductor device 100, the metal interconnect structure 168 is in direct contact with the enclosed protective dielectric structures 163 without a barrier metal layer. In some embodiments, the metal interconnect structure 168 is in direct contact with the top dielectric layer 121 and the one or more metal contact structures 106. In some embodiments, a top surface of the metal interconnect structure 168 is coplanar with a top surface 167-1 of the patterned dielectric layer. In some embodiments, the metal interconnect structure includes copper (Cu), and the protective dielectric material includes a boron nitride (BN) material.

The base device structure 120, as shown in semiconductor device 100 of FIG. 1, is a FinFET transistor device. However, the embodiments are readily applicable to other types of semiconductor device, which utilize high-speed interconnect structures. The other types of semiconductor device may include planar metal-oxide-semiconductor field effect transistor (planar MOSFET), gate-all-around (GAA) transistors, nanowire transistors, multiple-gate transistors, or the like. A more detailed description of base device structure 120 is provided below with reference to FIGS. 2A, 2B, 3A, and 3B.

Figure 2A:
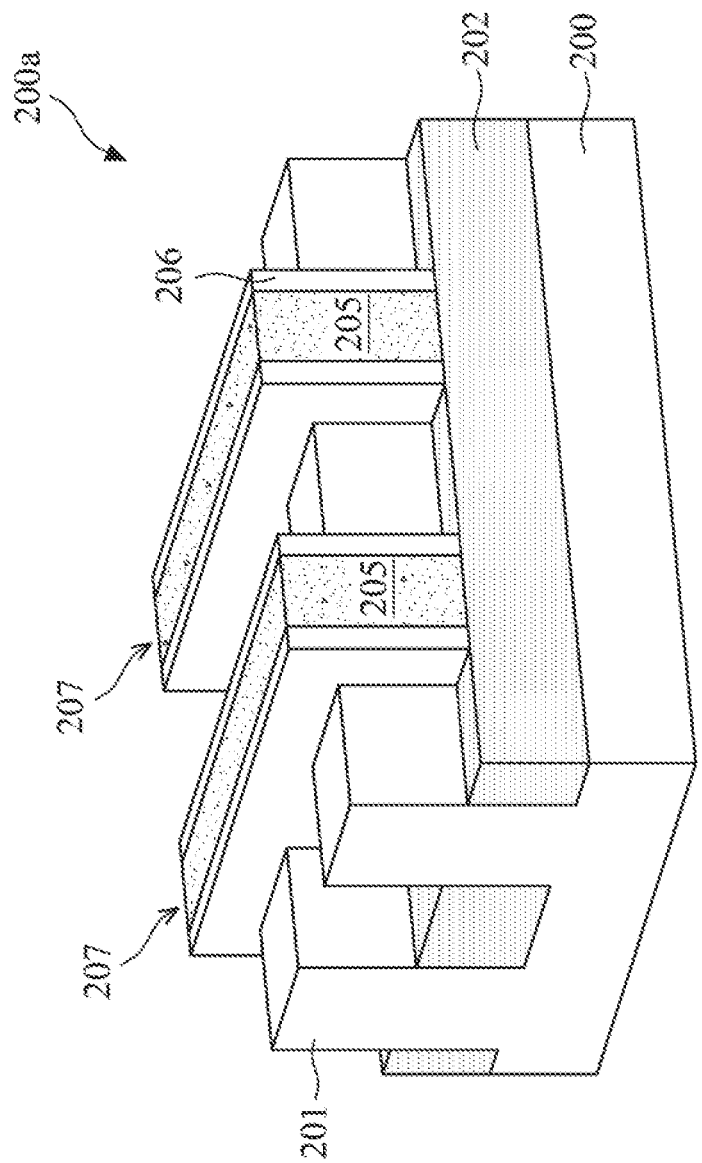
FIGS. 2A and 2B are three-dimensional (3D) view diagrams illustrating an intermediate structure of a semiconductor FinFET device, in accordance with some embodiments.
Figure 2B:
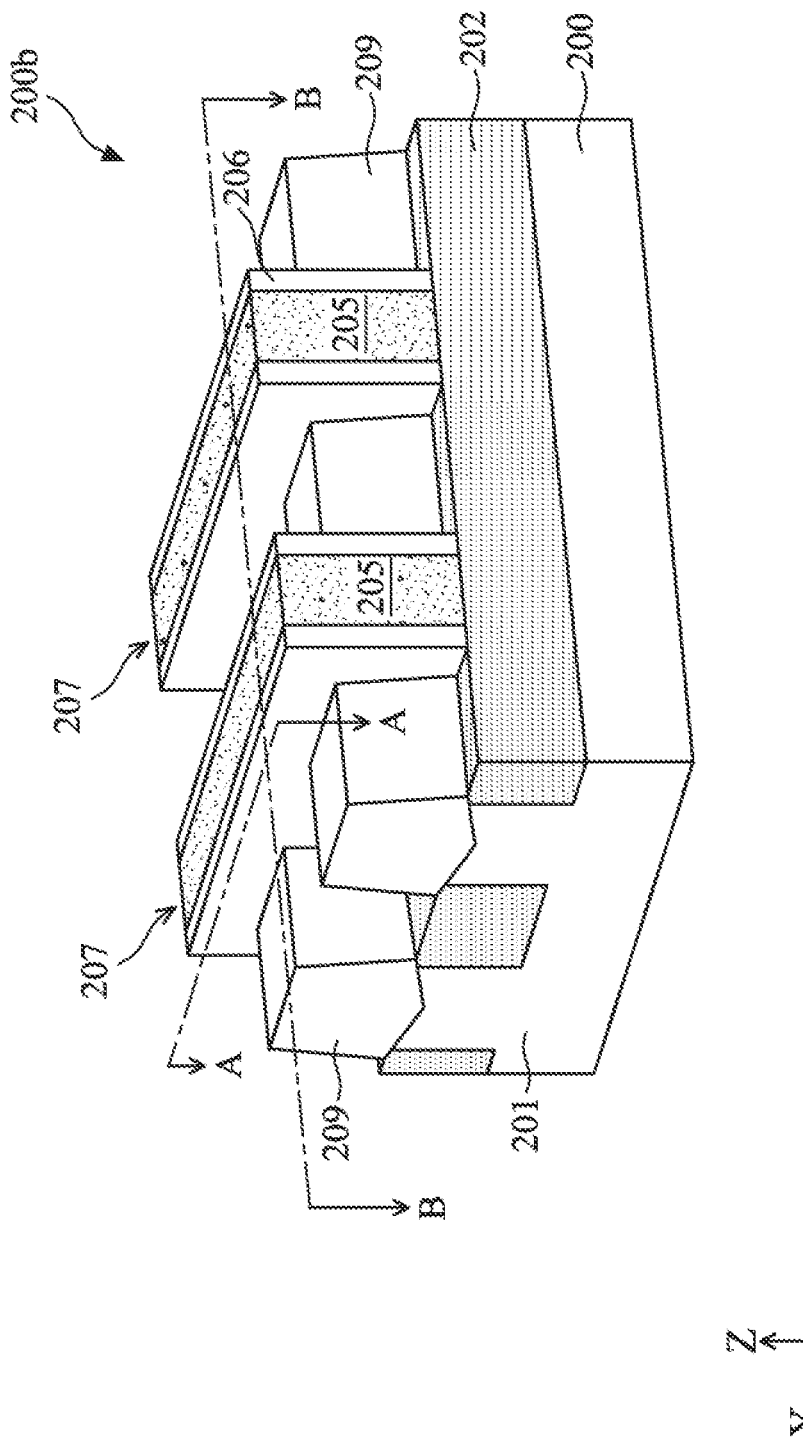

FIGS. 2A and 2B are three-dimensional (3D) views of intermediate structures of a semiconductor FinFET device, in accordance with some embodiments. Referring to FIG. 2A, semiconductor structure 200a includes a substrate 200 having a plurality of fins 201. The substrate 200 is a semiconductor substrate, such as a bulk semiconductor substrate, a semiconductor-on-insulator (SOI) substrate, or the like, which may be doped (e.g., with a p-type or an n-type dopant) or undoped. The substrate 200 may be a semiconductor wafer, such as a silicon wafer. Other substrates, such as a multi-layered or gradient substrate may also be used. In some embodiments, the material of the substrate 200 may include silicon; germanium; a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof.

Depending on the design, the substrate 200 may be a P-type substrate, an N-type substrate or a combination thereof and may have doped regions therein. The substrate 200 may be configured for an N-type FinFET device or a P-type FinFET device. In some embodiments, the substrate 200 for an N-type FinFET device may include Si, SiP, SiC, SiPC, InP, GaAs, AlAs, InAs, InAlAs, InGaAs or combinations thereof. The substrate 200 for a P-type FinFET device may include Si, SiGe, SiGeB, Ge, InSb, GaSb, InGaSb or combinations thereof.

The fins 201 protrude from a top surface of a body portion of the substrate 200. The substrate 200 has an isolation structure 202 formed thereon. The isolation structure 202 covers lower portions of the fins 201 and exposes upper portions of the fins 201. In some embodiments, the isolation structure 202 may include a shallow trench isolation (STI) structure, a cut poly structure, or a combination thereof. The isolation structure 202 includes an insulation material, which may be an oxide, such as silicon oxide, a nitride such as silicon nitride, the like, or combinations thereof.

A plurality of gate structures 207 are formed on the substrate 200 and across the plurality of fins 201. In some embodiments, the gate structures 207 are dummy gate structures and may be replaced by metallic gate structures through a gate replacement process in subsequent steps. In some embodiments, the gate structure 207 may include a dummy gate electrode 205 and spacers 206 on sidewalls of the dummy gate electrode 205.

The dummy gate electrodes 205 may be formed by the following processes: in some embodiments, a dummy layer is formed on the substrate 200 covering the fins 201, and the isolation structure 202, and the dummy layer is then patterned by photolithography and etching processes. In some embodiments, the dummy layer may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. In some embodiments, the dummy layer may include a silicon-containing material such as polysilicon, amorphous silicon, or combinations thereof. The dummy layer may be formed by a deposition process such as physical vapor deposition (PVD), chemical vapor deposition (CVD), or other suitable deposition process. In some embodiments, the fins 201 extend in the direction X, and the dummy gate electrodes 207 extend in the direction Y different from (e.g., perpendicular to) the direction X.

In some embodiments, a gate dielectric layer and/or an interfacial layer (not shown) may be disposed at least between the dummy gate electrode 205 and the fins 201 of the substrate 200. The gate dielectric layer and/or the interfacial layer may include silicon oxide, silicon nitride, silicon oxynitride, or the like, or combinations thereof, and may be formed by a thermal oxidation process, a suitable deposition process such as CVD, ALD, or other suitable process known in the art, or combinations thereof.

Spacers 206 are respectively formed on sidewalls of the dummy gate electrodes 205. In some embodiments, the spacer 206 includes SiO2, SiN, SiCN, SiOCN, SiC, SiOC, SiON, or the like, or combinations thereof.

Referring to FIG. 2A and FIG. 2B, in some embodiments, after the dummy gate structures 207 are formed, S/D regions 209 are formed on opposite sides of the gate structures 207, and the portions of the fins 201 covered by the gate structures 207 and laterally sandwiched between the S/D regions 209 serve as the channel regions. The S/D regions 209 may be located in and/or on the fins 201 of the substrate 200. In some embodiments, the S/D regions 209 are strained layers (epitaxial layers) formed by an epitaxial growing process such as a selective epitaxial growing process. In some embodiments, a recessing process is performed on the fins 201, and recesses are formed in the fins 201 on sides of the gate structure 207, and the strained layers are formed by selectively growing epitaxy layers from the fins 201 exposed in the recesses. In some embodiments, the strained layers include silicon germanium (SiGe), SiGeB, Ge, InSb, GaSb, InGaSb or combinations thereof for a P-type FinFET device. In alternative embodiments, the strained layers include silicon carbon (SiC), silicon phosphate (SiP), SiCP, InP, GaAs, AlAs, InAs, InAlAs, InGaAs or a SiC/SiP multi-layer structure, or combinations thereof for an N-type FinFET device. In some embodiments, the strained layers may be optionally implanted with an N-type dopant or a P-type dopant as needed.

In some embodiments, the fin 201 is recessed to have a top surface lower than the top surface of the isolation structure 202, and a portion of the S/D region 209 may be embedded in the isolation structure 202. For example, the S/D region 209 includes an embedded portion and a protruding portion on the embedded portion. The embedded portion is embedded in the isolation structure 202, and the protruding portion protrudes from the top surface of the isolation structure 202. However, the disclosure is not limited thereto. In alternative embodiments, the fin 201 may be recessed with a top surface higher than the top surface of the isolation structure 202, and the S/D region 209 may not be embedded in isolation structure 202, and may completely protrude above the top surface of the isolation structure 202.

It is noted that, the shape of the S/D region 209 shown in the figures is merely for illustration, and the disclosure is not limited thereto. The S/D region 209 may have any suitable shape according to product design and requirement.

Figure 3A:
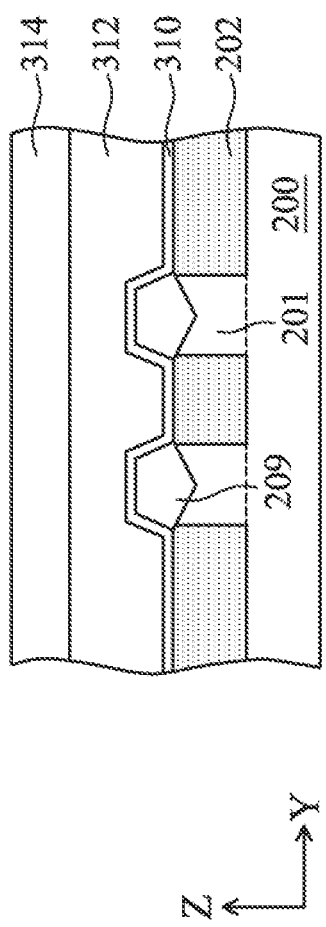
FIGS. 3A and 3B are cross-sectional view diagrams illustrating another intermediate structure of a semiconductor FinFET device, in accordance with some embodiments.
Figure 3B:
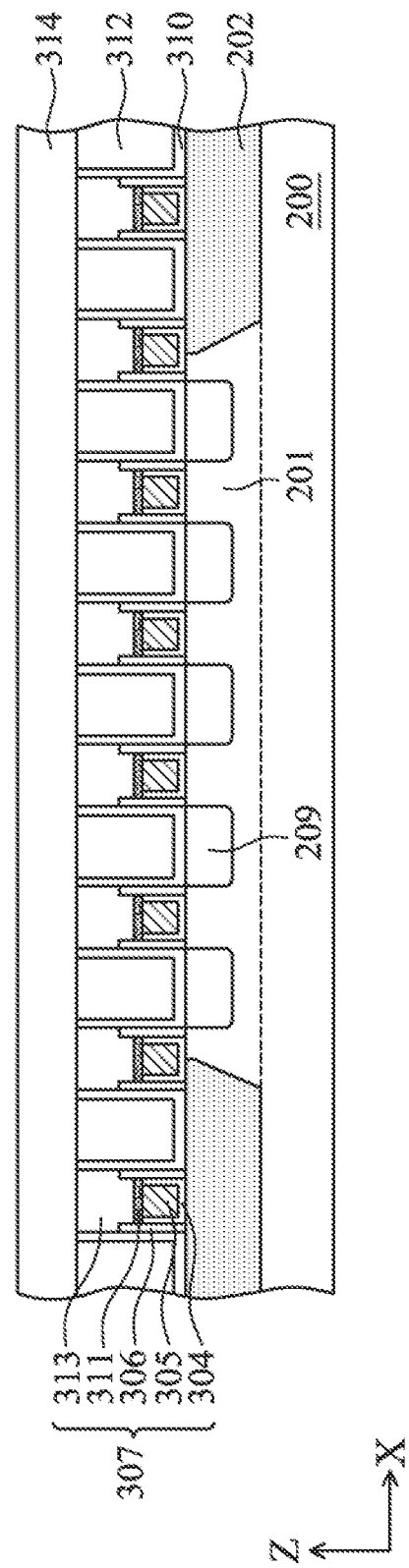

FIGS. 3A and 3B are schematic cross-sectional views illustrating intermediate stages for forming a semiconductor FinFET device, following the process of forming S/D regions 209 shown in FIG. 2B in accordance with some embodiments. FIG. 3A illustrates the subsequent processes performed on the semiconductor device 200b taken along A-A line of FIG. 2B, while FIG. 3B illustrates the subsequent processes performed on the semiconductor device 200b taken along B-B line of FIG. 2B.

Referring to FIGS. 2B, 3A, and 3B, in some embodiments, after the S/D regions 209 are formed on sides of the gate structure 207 in FIG. 2B, an etching stop layer 310 and a dielectric layer 312 are formed laterally aside the gate structure 207, and the gate structure 207 is replaced by a gate structure 307 in FIG. 3B, and a dielectric layer 314 is formed on the gate structure 307 and the dielectric layer 312.

In some embodiments, the etching stop layer 310 may also be referred to as a contact etch stop layer (CESL), and is disposed between the substrate 200 (e. g., the S/D regions 209 and the isolation structure 202 of the substrate 200) and the dielectric layer 312 and between the gate structure 307 and the dielectric layer 312. In some embodiments, the etching stop layer 310 includes SiN, SiC, SiOC, SiON, SiCN, SiOCN, or the like, or combinations thereof. The etching stop layer 310 may be formed by CVD, plasma-enhanced CVD (PECVD), flowable CVD (FCVD), ALD or the like.

The dielectric layer 312 is formed laterally aside the gate structure 307, and may have a top surface substantially coplanar with the top surface of the gate structure 307. The dielectric layer 312 includes a material different from that of the etching stop layer 310. In some embodiments, the dielectric layer 312 may also be referred to as an interlayer dielectric layer (ILD), such as ILD0. In some embodiments, the dielectric layer 312 includes silicon oxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the dielectric layer 312 may include low-k dielectric material with a dielectric constant lower than 4 or extreme low-k (ELK) dielectric material with a dielectric constant lower than 2.5. In some embodiments, the low-k material includes a polymer-based material, such as benzocyclobutene (BCB), FLARE®, or SILK®; or a silicon dioxide-based material, such as hydrogen silsesquioxane (HSQ) or SiOF. The dielectric layer 312 may be a single layer structure or a multi-layer structure. The dielectric layer 312 may be formed by CVD, PECVD, FCVD, spin coating, or the like.

In some embodiments, the etching stop layer 310 and the dielectric layer 312 may be formed by the following processes: after the S/D regions 209 are formed as shown in FIG. 2B, an etching stop material layer and a dielectric material layer are formed over the substrate 200 to cover the isolation structure 202, the S/D regions 209, and the gate structure 207; thereafter, a planarization process is performed to remove excess portions of the etching stop material layer and the dielectric material layer over the top surfaces of the gate structures 207, so as to expose the gate structure 207, and the etching stop layer 310 and the dielectric layer 312 are thus formed laterally aside the gate structures 207.

In some embodiments, after the formation of the etching stop layer 310 and the dielectric layer 312, the gate structure 207 is replaced by the gate structure 307 through a gate replacement process. In some embodiments, the gate structure 307 is a metallic gate structure and may include a gate dielectric layer 304, a gate electrode 305, a protection layer 311, spacers 306 and a helmet 213.

In some embodiments, the gate electrode 305 is a metallic gate electrode, and may include a work function metal layer and a metal filling layer on the work function metal layer. The work functional metal layer is configured to tune a work function of its corresponding FinFET to achieve a desired threshold voltage Vt. The work function metal layer may be an N-type work function metal layer or a P-type work function metal layer. In some embodiments, the P-type work function metal layer includes a metal with a sufficiently large effective work function and may include one or more of the following: TiN, WN, TaN, conductive metal oxide, and/or a suitable material, or combinations thereof. In alternative embodiments, the N-type work function metal layer includes a metal with sufficiently low effective work function and may comprise one or more of the following: tantalum (Ta), titanium aluminide (TiAl), titanium aluminum nitride (TiAlN), tantalum carbide (TaC), tantalum carbide nitride (TaCN), tantalum silicon nitride (TaSiN), titanium silicon nitride (TiSiN), other suitable metals, suitable conductive metal oxide, or combinations thereof. The metal filling layer may include copper, aluminum, tungsten, cobalt (Co), or any other suitable metallic material, or the like or combinations thereof. In some embodiments, the metal gate electrode 305 may further include a liner layer, an interface layer, a seed layer, an adhesion layer, a barrier layer, combinations thereof or the like.

In some embodiments, the gate dielectric layer 304 surrounds the sidewalls and bottom surface of the gate electrode 305. In alternative embodiments, the gate dielectric layer 304 may be disposed on the bottom surface of the gate electrode 305 and between the gate electrode 305 and the substrate 200, without being disposed on sidewalls of the gate electrode 305. In some embodiments, the gate dielectric layer 304 may include silicon oxide, silicon nitride, silicon oxynitride, high-k dielectric materials, or combinations thereof. The high-k dielectric material may have a dielectric constant such as greater than about 4, or greater than about 7 or 10. In some embodiments, the high-k material includes metal oxide, such as ZrO2, Gd2O3, HfO2, BaTiO3, Al2O3, LaO2, TiO2, Ta2O5, Y2O3, STO, BTO, BaZrO, HfZrO, HfLaO, HfTaO, HfTiO, combinations thereof, or a suitable material. In alternative embodiments, the gate dielectric layer 104 may optionally include a silicate such as HfSiO, LaSiO, AlSiO, combinations thereof, or a suitable material.

In some embodiments, a protection layer 311 is optionally formed on the gate electrode 305. In some embodiments, the protection layer 311 includes substantially fluorine-free tungsten (FFW) film. The FFW film may be formed by atomic layer deposition (ALD) or CVD using one or more non-fluorine-based W precursors such as, but not limited to, tungsten pentachloride (WCl5), tungsten hexachloride (WCl6), or a combination thereof. In some embodiments, the protection layer 311 is formed to cover the gate electrode 305 and may further extend to cover the top surface of the gate dielectric layer 304 and contact the spacers 306. In alternative embodiments, the protection layer 311 merely covers the top surface of the metal gate electrodes 305. The sidewalls of the protection layer 311 may be aligned with the sidewalls of the gate electrode 305 or the sidewalls of the gate dielectric layer 304, and the disclosure is not limited thereto.

The spacers 306 are disposed on sidewalls of the gate electrode 305, and portions of the gate dielectric layer 304 may be laterally sandwiched between the gate electrode 305 and the spacers 306. The spacers 306 may have a height less than the spacers 206 in FIG. 2B, but the disclosure is not limited thereto. In some embodiments, the top surfaces of the spacers 306 are higher than the top surface of the protection layer 311 on the gate electrode 305.

In some embodiments, the helmet 313 is formed over the gate electrode 305 to cover the protection layer 311 and the spacers 306. The helmet 313 includes a dielectric material, such as nitride (e. g., silicon nitride), oxide (e. g., silicon oxide), silicon oxycarbide, or the like, or combinations thereof, and the disclosure is not limited thereto.

In some embodiments, the formation of the gate structure 307 includes a gate replacement process. For example, the dummy gate electrode 205 and/or the dummy dielectric layer/interfacial layer of the dummy gate structure 207 in FIG. 2B are removed, and a gate trench defined by the spacers 206 is formed. A gate dielectric material layer and gate electrode materials are then formed within the gate trench. Thereafter, recessing processes are performed to remove portions of the gate dielectric material layer and the gate electrode materials, and the gate dielectric layer 304 and gate electrode 305 are thus formed. In some embodiments, portions of the spacers 206 may also be removed to form the spacers 306 with a smaller height. The protection layer 311 is formed on the gate electrode 305, and the helmet 313 is then formed to cover the protection layer 311 and the spacers 306. In some embodiments, the top surface of the helmet 313 is substantially coplanar with the top surface of the dielectric layer 312.

Thereafter, the dielectric layer 314 is formed on the gate structure 307 and the dielectric layer 312. The material of dielectric layer 314 may be selected from the same candidate materials as the dielectric layer 312, and may be formed by a similar process of the dielectric layer 312. The dielectric layer 314 may also be referred to as an interlayer dielectric layer (ILD), such as ILD1. In some embodiments, both of the dielectric layer 312 and the dielectric layer 314 include silicon oxide formed by FCVD process. In some embodiments, an etching stop layer (not shown) may further be formed on the gate structure 307 and dielectric layer 312 before forming the dielectric layer 314.

The method of forming a semiconductor device generally includes forming metal interconnect structures following the formation of a base device such as the base device structures described above in connection with FIGS. 2A, 2B, 3A, and 3B. An example of such a semiconductor device is described above in connection to FIG. 1, and a method for forming the semiconductor device is presented below.

Figure 4:
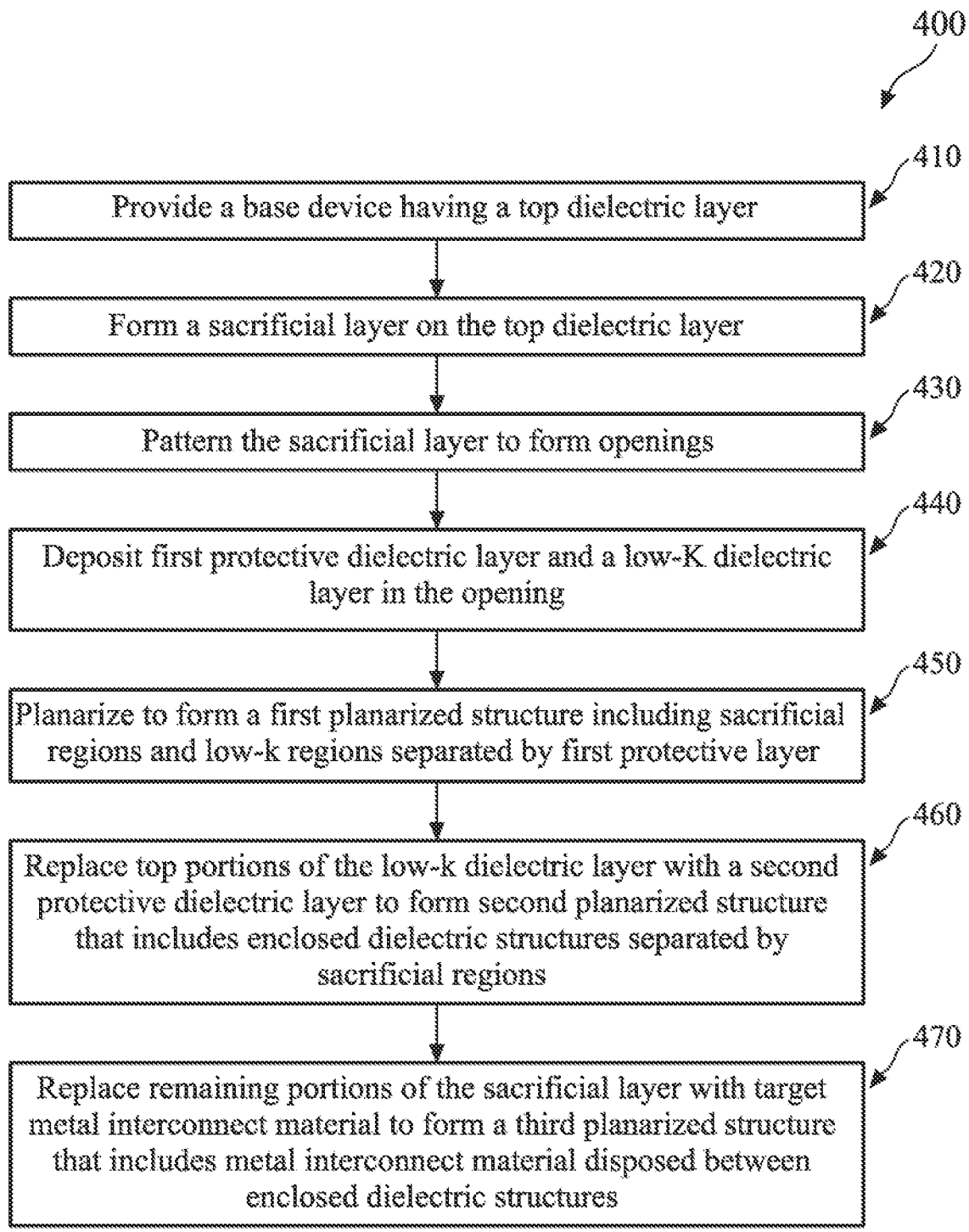
FIG. 4 is a simplified flowchart of a method for forming a semiconductor device, in accordance with some embodiments.

FIG. 4 is a simplified flowchart of a method for forming a semiconductor device, in accordance with some embodiments. The flowchart in FIG. 4 outlines a method 400 for forming an interconnect structure on a base device, in which the Cu interconnect is formed in a dielectric layer without a high resistance barrier meal layer between the metal interconnect and the dielectric. The method 400 is outlined in the following processes and then described below in further details.

- 410—Provide a base device having a top dielectric layer;
- 420—Form a sacrificial layer on the top dielectric layer;
- 430—Pattern the sacrificial layer to form openings;
- 440—Deposit first protective dielectric layer and a low-K dielectric layer in the opening;
- 450—Planarize to form a first planarized structure including sacrificial regions and low-k regions separated by first protective layer;
- 460—Replace top portions of the low-k dielectric layer with a second protective dielectric layer to form a second planarized structure that includes enclosed dielectric structures separated by sacrificial regions; and
- 470—Replace remaining portions of the sacrificial layer with target metal interconnect material to form a third planarized structure that includes metal interconnect material disposed between enclosed dielectric structures.

The processes of method 400 are described in detail below with reference to FIGS. 5A-5L.

FIGS. 5A to 5L are cross-sectional view diagrams illustrating various stages of a method for forming a semiconductor device, in accordance with some embodiments.

Figure 5A:
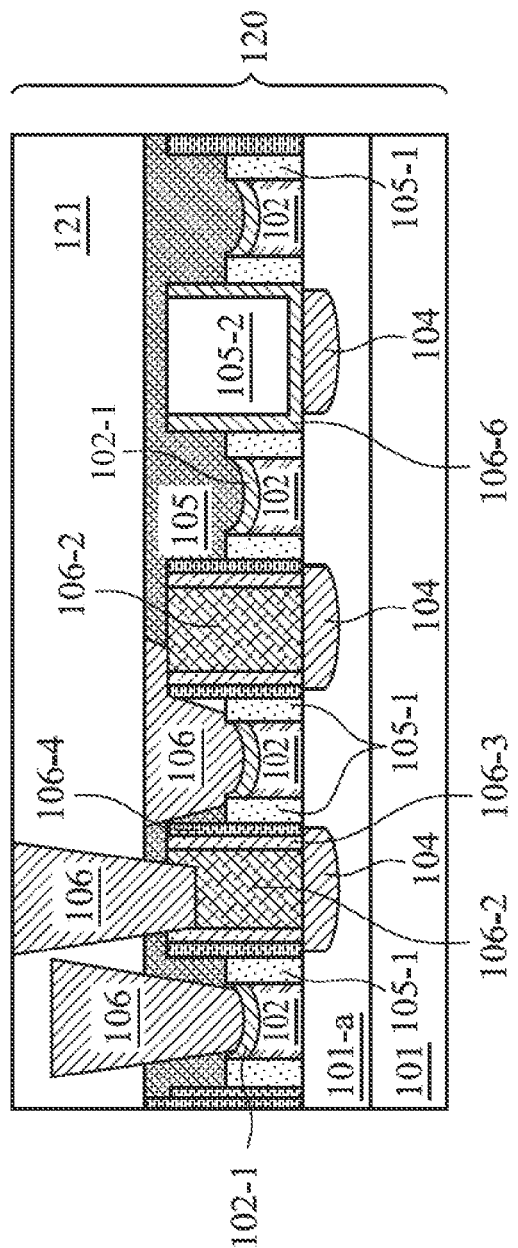
FIGS. 5A to 5L are cross-sectional view diagrams illustrating various stages of a method for forming a semiconductor device, in accordance with some embodiments.

FIG. 5A is a cross-sectional view diagram illustrating a first stage of the method for forming a semiconductor device, in accordance with some embodiments. In process 410, method 400 starts with providing a base device having a top dielectric layer. As shown in FIG. 5A, base device structure 120 has a top dielectric layer 121 and metal contact structures 106 disposed in the top dielectric layer 121.

In some embodiments, base device structure 120 in FIG. 5A is similar to base device structure 120 in FIG. 1. As shown in FIG. 5A, base device structure 120 includes a FinFET, having a substrate 101 having a fin structure 101-*a*, a gate structure 102 across the fin structure 101-*a*, a source/drain (S/D) region 104 in and/or on the fin structure 101-*a*, and on a side of the gate structure 102. Base device structure 120 also includes a top dielectric layer 121 and metal contact structures 106 disposed in the top dielectric layer 121 and in contact with the gate structure 102 and the source/drain (S/D) region 104. The top dielectric layer 121 can be an interlayer dielectric layer (ILD) in a multi-level interconnect structure.

In some embodiments of the base device structure 120, gate structure 102 is a metal gate structure, with a tungsten (W) cap layer 102-1 on top and a dielectric layer, e.g., a low-k dielectric 105-1, at the sides. Further, source/drain region 104 is an epitaxial semiconductor layer. The contact structure 106 can be a tungsten plug on top of a cobalt contact 106-2, which contacts the source/drain region 104. A barrier layer, e.g., titanium nitride (TiN), 106-3 and a dielectric layer, e.g., silicon nitride (SiN), 106-4 are disposed on the side of contact 106-2. In some embodiments, a dielectric structure 105-2 is disposed on a source/drain region 104 and separated from the source/drain region 104 by a bottom contact etching stop layer (BCESL) 106-6, which can be a silicon nitride (SiN) layer. Further, a dielectric layer 105, e.g., a silicon nitride (SiN) layer, is disposed over the transistor device structures.

The description above associated with FIG. 5A applies to an embodiment of base device structure 120 for illustration purposes. Further details and options of the materials and processes for forming the base device structure 120, including the FinFET transistors, are described above in connection to FIGS. 2A, 2B, 3A, and 3B.

Figure 5B:
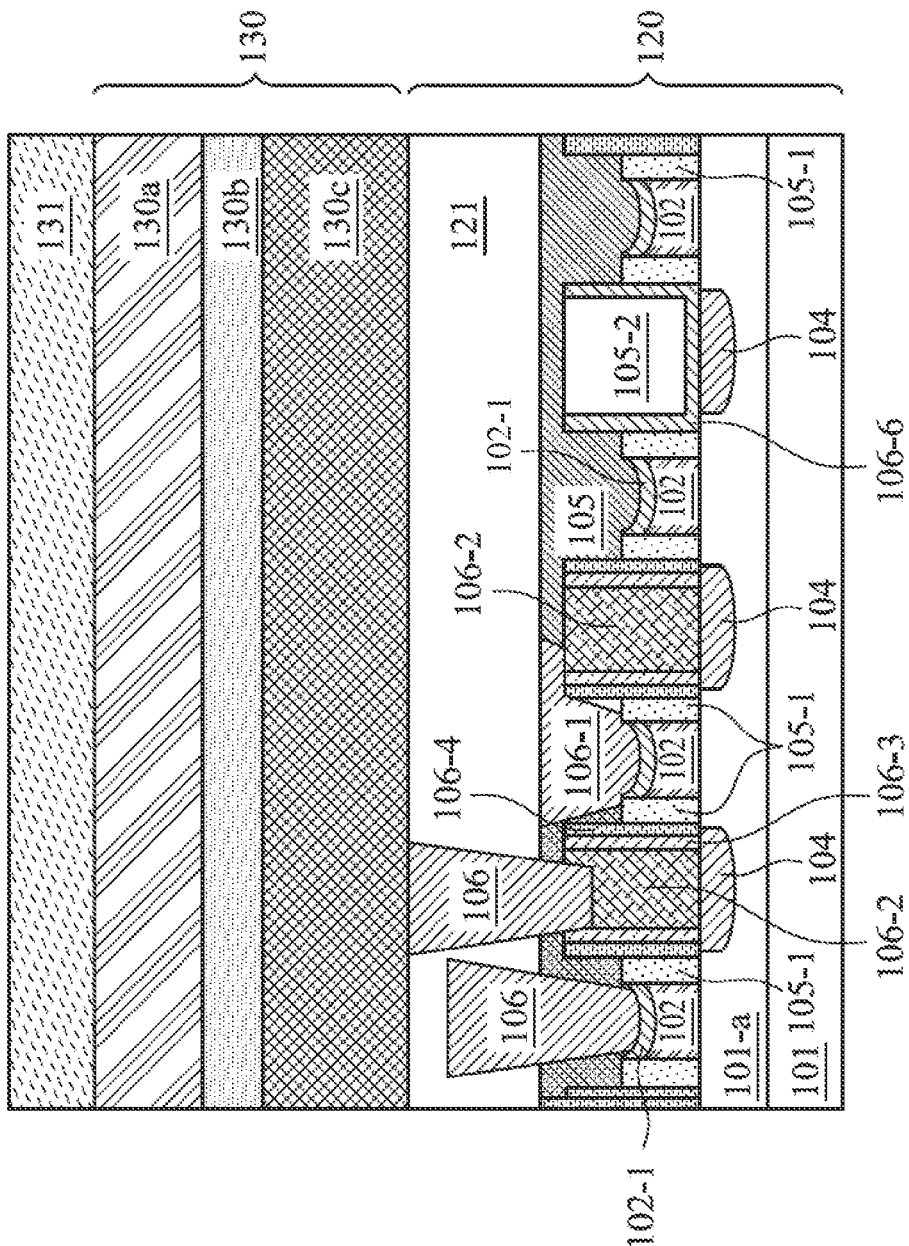

In process 420, as shown in FIG. 5B, method 400 includes forming a sacrificial layer 130 on the top dielectric layer 121 and a first hard mask layer 131 on sacrificial layer 130. As described in more detail below, sacrificial layer 130 is used as a place holder and will be replaced by the eventual metal interconnect structure. In some embodiments, the metal interconnect structures are formed using a cut metal process. The cut metal process includes two exposure steps and two etching steps (so-called 2P2E), which reduce spacing between line features.

In some embodiments, sacrificial layer 130 includes a stack of multiple layers of different material. In the embodiment shown in FIG. 5B, sacrificial layer 130 includes a stack of layers 130*a*, 130*b*, and 130*c*. In some embodiments, layer 130*a* is a dielectric layer, such as TEOS, or other suitable dielectric layer. Layer 130*b* includes TiN or other adhesion or barrier metal. Layer 130*c* is configured to be a dummy interconnect layer, which can include silicon (Si), ruthenium (Ru), or tungsten (W). As will be noted below, the metal layers of Ru and W have lower diffusivities in dielectric than Cu, which will make the fabrication process simpler.

Next a first hard mask layer 131 is deposited on the sacrificial layer 130. In this example, the material for the first hard mask layer 131 is tungsten-doped carbide (WdC). Other suitable material can also be used as the first hard mask layer 131, such as tungsten (W), titanium nitride (TiN), etc.

Figure 5C:
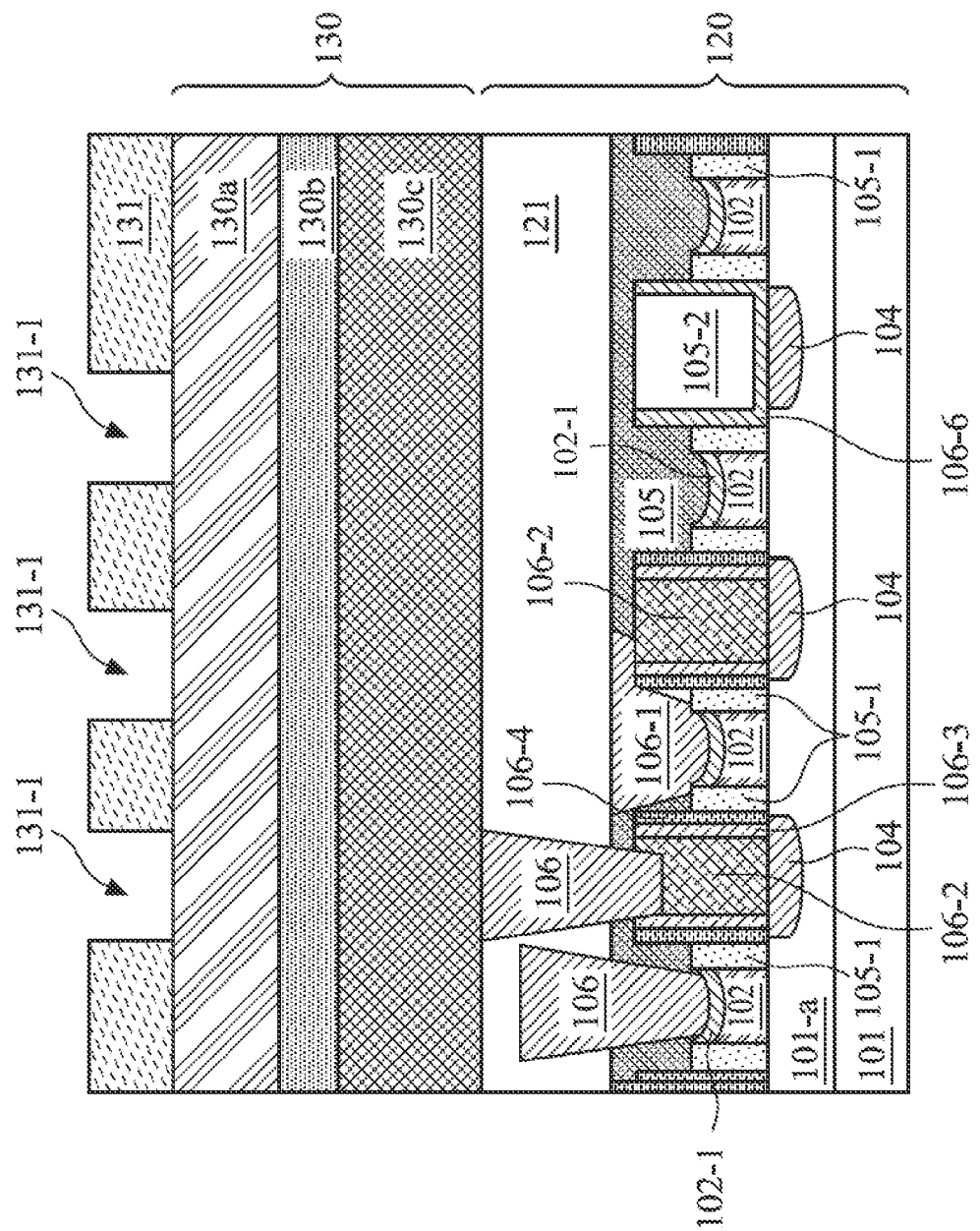
Figure 5D:
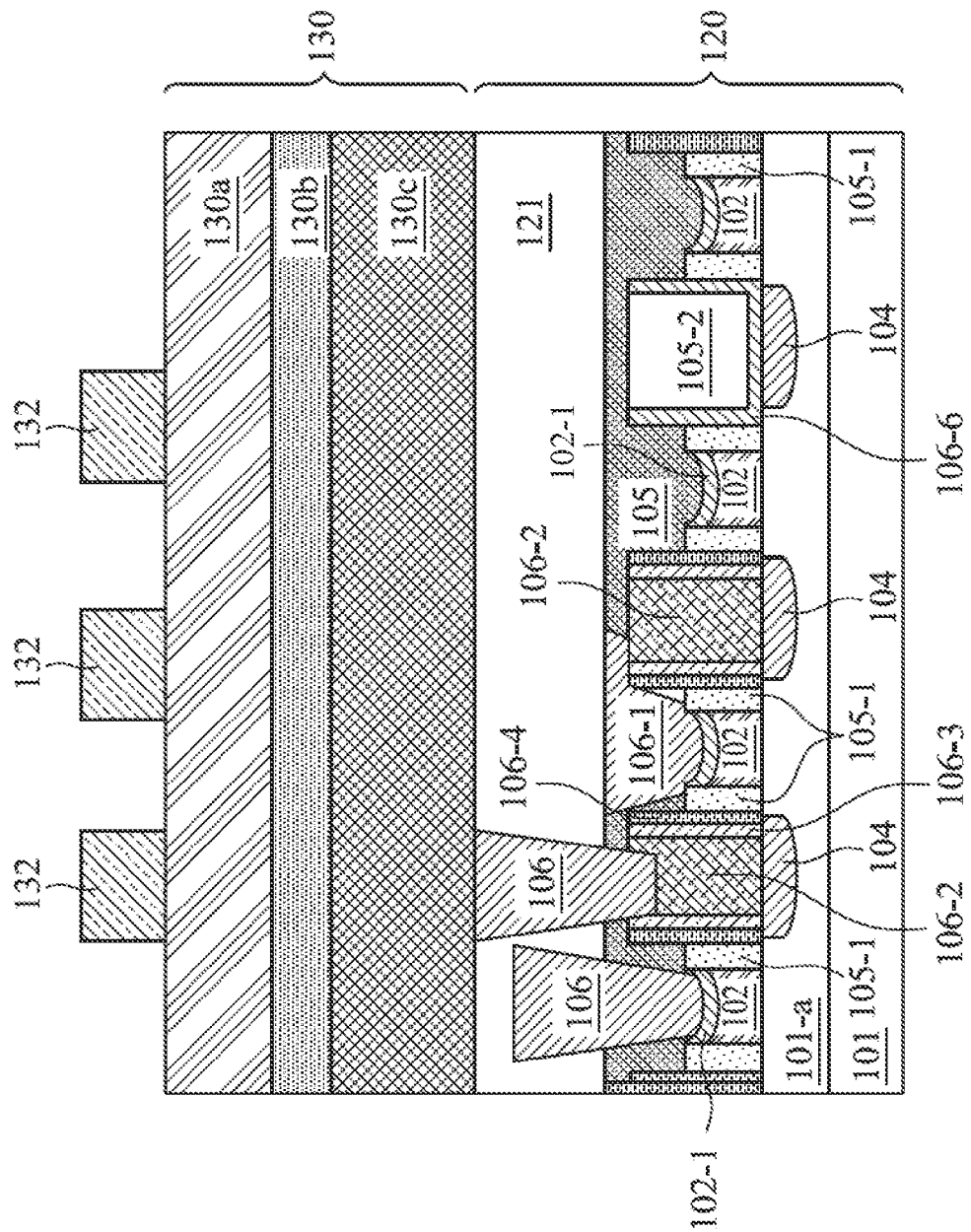
Figure 5E:
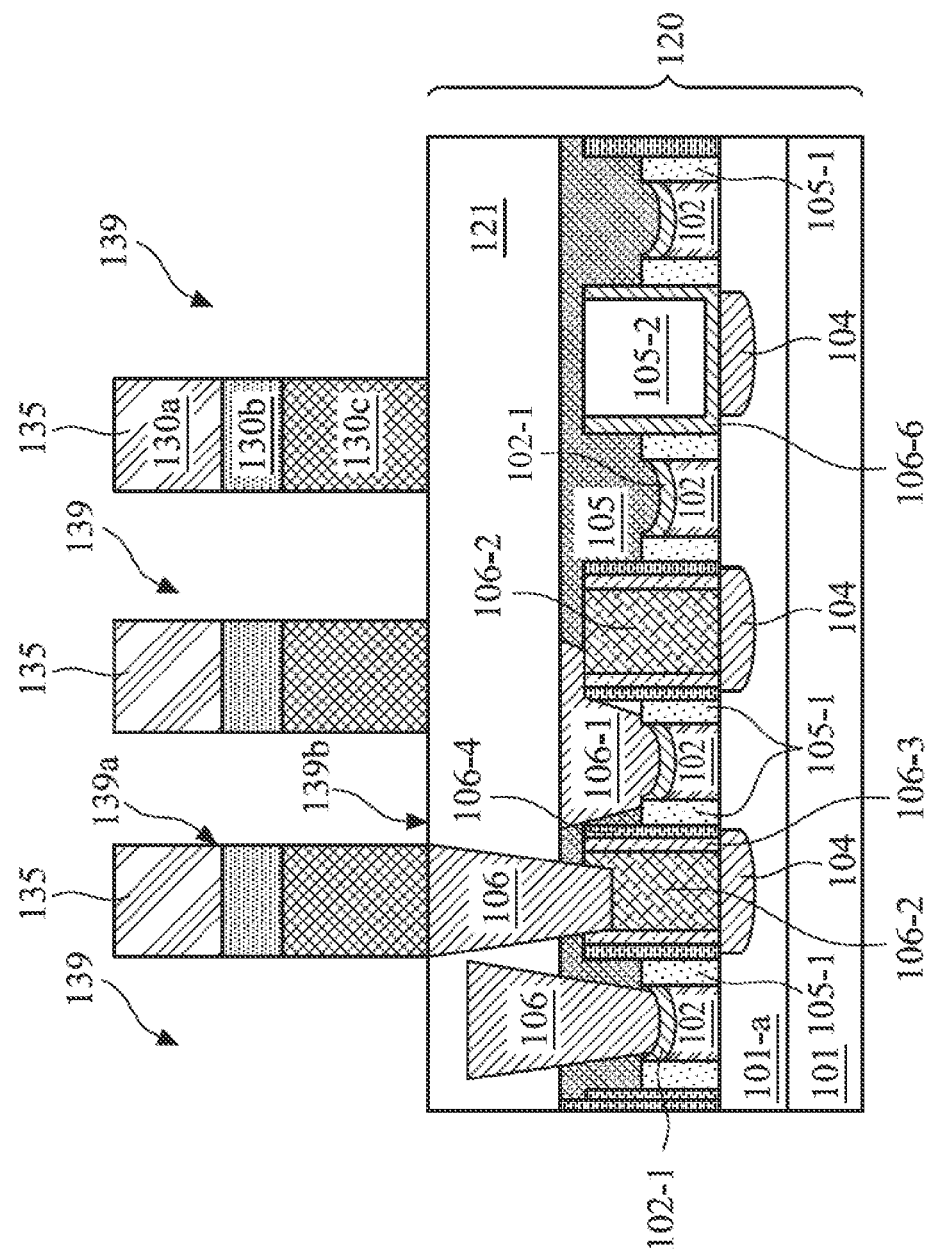

In process 430, method 400 includes patterning the sacrificial layer 130 to form openings, as illustrated in FIGS. 5C, 5D, and 5E.

In FIG. 5C, a first hard mask layer 131 is patterned to form openings 131-1. As illustrated below, openings 131-1 are designed for a metal interconnect structure in a metal replacement process. The patterning of hard mask layer 131 can be performed using a lithographic process. In some embodiments, a 2P2E (two-photo-two-etch) patterning process is used to pattern the hard mask layer 131. In the 2P2E process, a first exposure of a photoresist layer is followed by an etch. After the photoresist is removed, a second layer of photoresist is deposited and is subject to a second exposure followed by a second etch. The finished photoresist pattern is a composite of the photoresist patterns from the two exposures. The 2P2E process provides line patterns that have smaller line width and line pitch than can be achieved in the single photo and single etch process.

Next, as shown in FIG. 5D, a second hard mask 132 is formed in openings 131-1 in the first hard mask layer 131 in FIG. 5C. First, opening 131-1 in FIG. 5C is filled with a suitable hard mask material, such as silicon (Si). Next, a planarization process is used to remove the excess hard mask material on the first hard mask material 131. Then, the patterned first hard mask layer 131 is removed by an etching process, resulting in a second hard mask layer 132, as shown in FIG. 5D. In some embodiments, the planarization process includes chemical-mechanical-polishing (CMP).

Next, the patterned second hard mask 132 is used to etch the sacrificial layer 130 to form patterns for the subsequent interconnect process. FIG. 5E is a cross-sectional view diagram illustrating patterned sacrificial regions 135 and openings 139 in the sacrificial layer after the etching process, in accordance with some embodiments. Using patterned second hard mask layer 132 as a mask, the stack of layers 130a, 130b, and 130c of the sacrificial layer 130 is etched to form patterned sacrificial regions 135 and openings 139 in the sacrificial layer 130. Each opening 139 has sidewalls 139a and a bottom surface 139b.

Figure 5F:
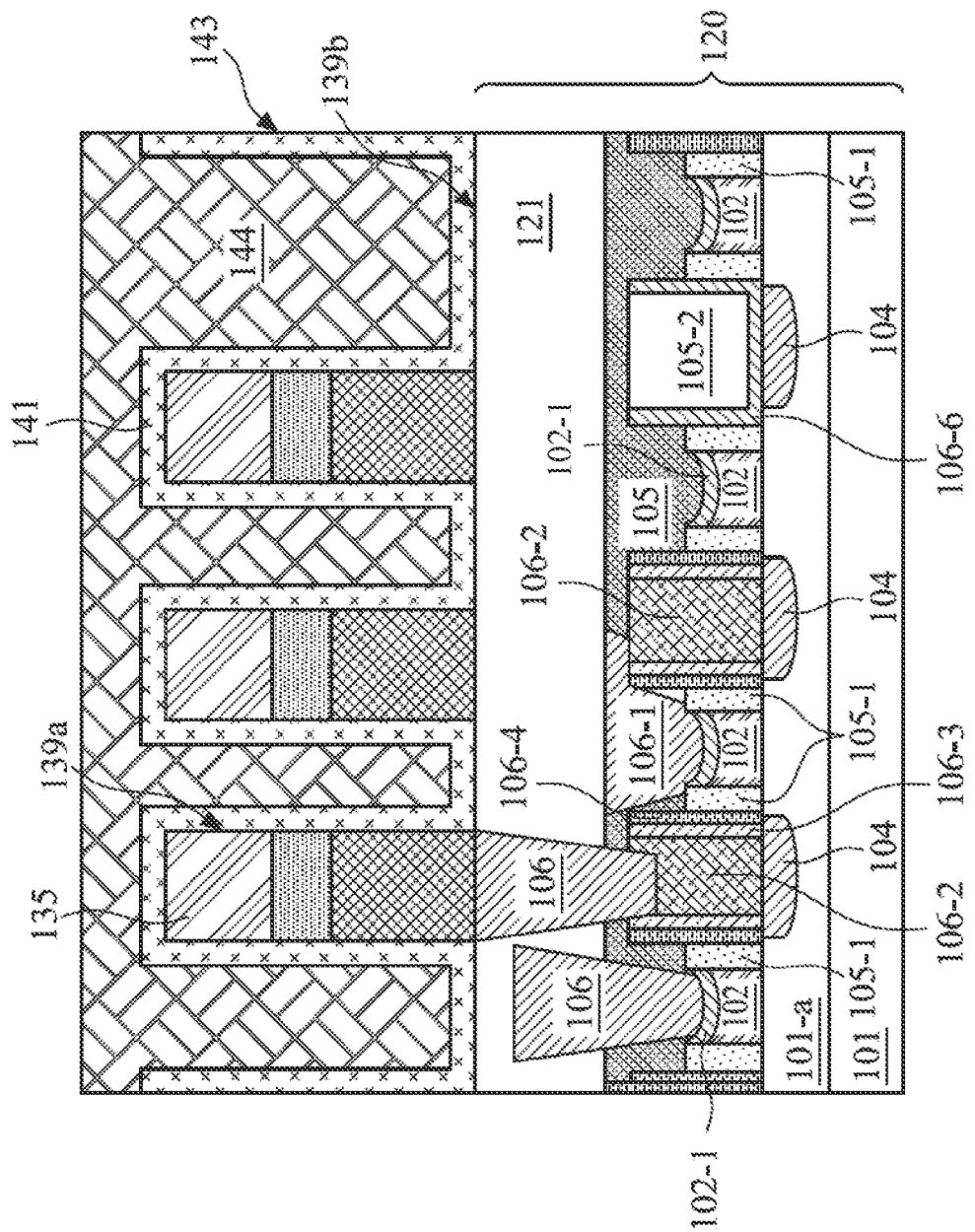

Next, in process 440, as illustrated in FIG. 5F, method 400 includes depositing a first protective dielectric layer and a low-K dielectric layer in the openings 139 and over the sacrificial regions 135 in FIG. 5E. As shown in FIG. 5F, a first protective dielectric layer 141 is deposited, and then a low-k dielectric material 144 is deposited on the first protective dielectric layer 141.

In some embodiments, the first protective dielectric layer 141 includes a boron nitride (BN) material, such as amorphous boron nitride (a-BN), hexagonal boron nitride (h-BN), etc. These BN materials have the properties of being a diffusion barrier, in addition to having a low dielectric constant. The BN materials have been shown to be effective barrier material against Cu diffusion based on breakdown, lifetime, and material analysis.

In some embodiments, the BN film is deposited by ALD or CVD with a DED (Deposition-Etching-Deposition or Directed Energy Deposition) process. The BN precursors could be $B_3N_3H_6$ or $B_2H_6$ processed by NH3, N2, N2H4 or N2/H2 plasma.

In some embodiments, the low-k dielectric layer 144 includes SiCO deposited by FCVD. The SiCO is silicon oxide SiOx doped with CHy, where x and y are suitable integers, and low-k SiCO material has a dielectric constant k of about 2.8~3.1. In other embodiments, the low-k dielectric layer 144 may include a low-k dielectric material having a dielectric constant, k, less than that of silicon dioxide, which is about 3.9, or an extreme low-k (ELK) dielectric material with a dielectric constant lower than 2.5. In some embodiments, the low-k material includes a polymer-based material, such as benzocyclobutene (BCB), FLARE®, or SILK®; or a silicon dioxide-based material, such as hydrogen silsesquioxane (HSQ) or SiOF. The low-k dielectric layer 144 may be a single layer structure or a multi-layer structure and may be formed by CVD, PECVD, FCVD, spin coating, or the like.

It is noted that the metal materials for the lower portion of the sacrificial regions 135, such as Ru, Mo, or W, have diffusivities lower than that of Cu. Therefore, there is no need for TaN as a diffusion barrier during the process described here. Further, in FIG. 5F, a layer of the first protective dielectric layer 141 is shown at the outer edges 143 of the low-k dielectric layer 144 for illustration purposes to indicate that the layer of the first protective dielectric layer 141 is formed on the sidewall of an isolation region 135 or a similar structure.

Figure 5G:
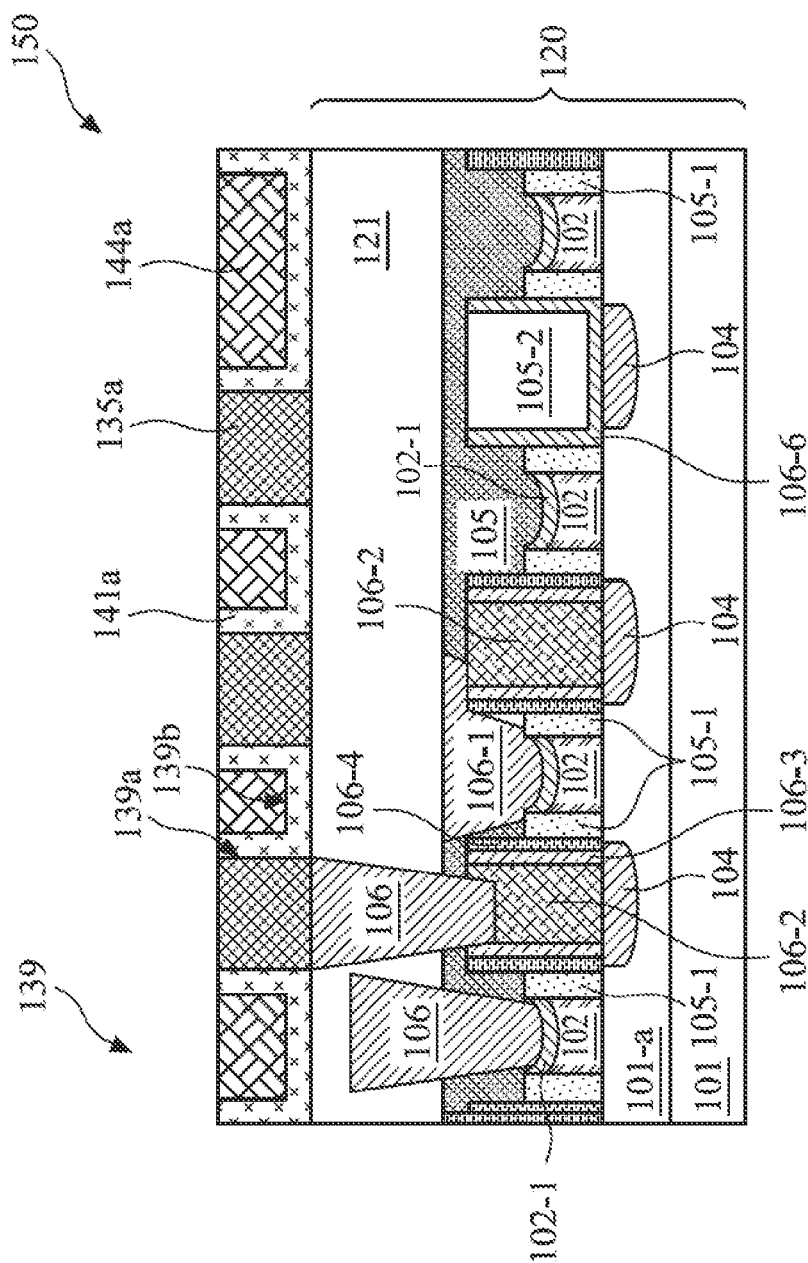

Next, in process 450, method 400 includes performing a planarization process to form a first planarized structure including sacrificial regions and low k regions separated by the first protective layer. As illustrated in FIG. 5G, a first planarization process is performed on the structure in FIG. 5F to form a first planarized structure 150, which includes:
  a lower portion 135a of the sacrificial regions 135,
  a lower portion 141a of the first protective dielectric layer, and
  the low-k dielectric material 144a filling the openings 139.

The lower portion 141a of the first protective dielectric layer is deposited lining the sidewalls 139a and the bottom surface 139b of the openings in the lower portion 135a of the sacrificial region 135.

In some embodiments, the dielectric layer 144a may include low-k dielectric material having a dielectric constant, k, less than that of silicon dioxide, which is about 3.9, or low-k (ELK) dielectric material with a dielectric constant lower than 2.5. In some embodiments, the low-k material includes a polymer-based material, such as benzocyclobutene (BCB), FLARE®, or SILK®; or a silicon dioxide-based material, such as hydrogen silsesquioxane (HSQ) or SiOF, or SiOC. The dielectric layer 144a may be a single layer structure or a multi-layer structure. The dielectric layer 144a may be formed by CVD, PECVD, FCVD, spin coating, or the like.

Next, process 460 of method 400 includes replacing the top portions of the low-k dielectric layer with a second protective dielectric layer to form a second planarized structure that includes enclosed dielectric structures separated by sacrificial regions. Process 460 is illustrated in FIGS. 5H, 5I, and 5J.

Figure 5H:
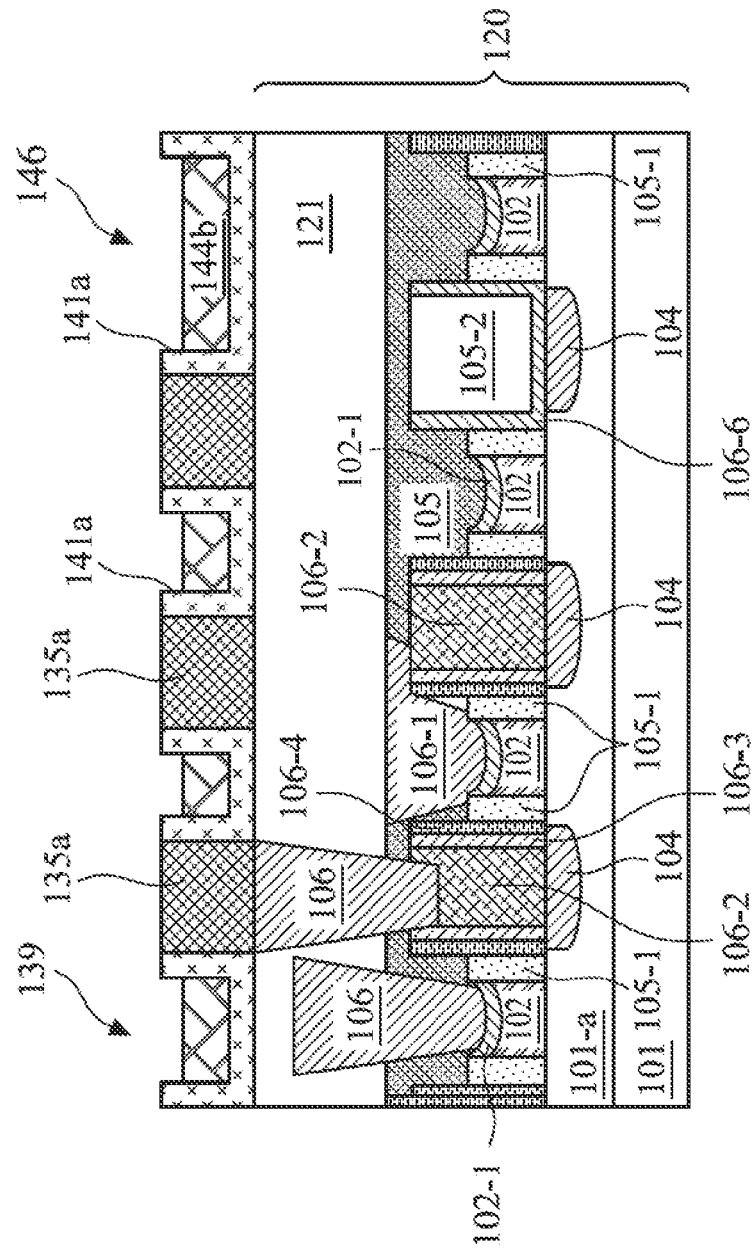

First, as shown in FIG. 5H, a top portion of the low-k dielectric material 144a is removed to form a recess 146, leaving the first protective dielectric layer 141a lining the sidewalls of the openings 139 in the lower portion of the sacrificial region 135a and a remaining portion 144b of the low-k dielectric material 144a. In some embodiments, the recess process uses a diluted hydrofluoric acid (dHF) process. In some embodiments, the low-k dielectric material 144a is recessed in a selective manner, leaving a top portion of the protective liner 141a on the sidewalls of trenches, such that the top surface of BN layer is coplanar with the top of the sacrificial regions. In an alternative process, the recess process can remove top portions of both low-k dielectric layer 144a and the first protective dielectric layer 141, such that the top surfaces of both LK and BN are below the top of the sacrificial regions. The depth of the recess 146 is determined to accommodate the formation of the second protective dielectric layer on top of a remaining portion 144b of the low-k dielectric material, as described below.

Figure 5I:
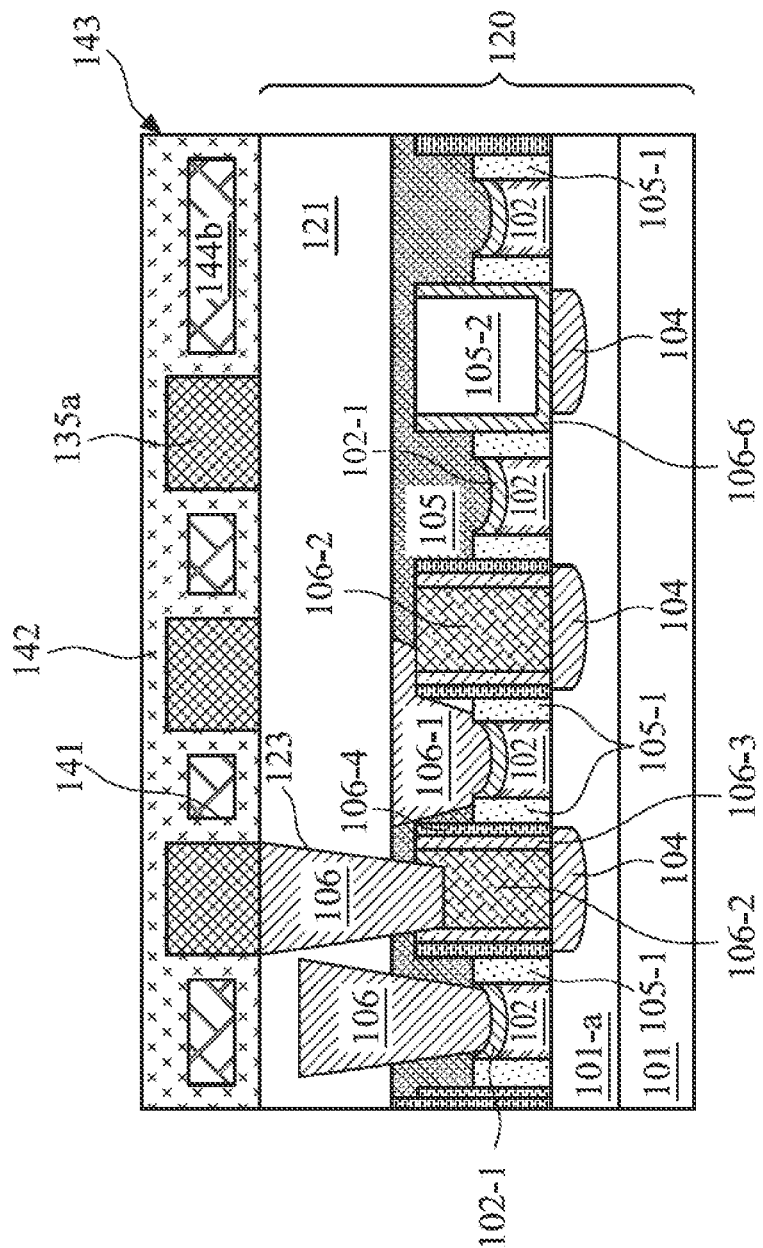

Next, as shown in FIG. 5I, a second protective dielectric layer 142 is deposited on the remaining portions 144b of the low-k dielectric material and the sacrificial regions 135a. In some embodiments, the material for the second protective dielectric layer 142 is the same as that for the first protective dielectric layer 141 and similar deposition processes can be used. In some embodiments, the second protective dielectric layer 142 includes a boron nitride (BN) material, such as amorphous boron nitride (a-BN), hexagonal boron nitride (h-BN), etc. In some embodiments, the BN film is deposited by ALD or CVD with DED (Deposition-Etching-Deposition or Directed Energy Deposition) process. The precursors for the BN material can be $B_3N_3H_6$ or $B_2H_6$, which is processed by NH3, N2, N2H4 or N2/H2 plasma.

Figure 5J:
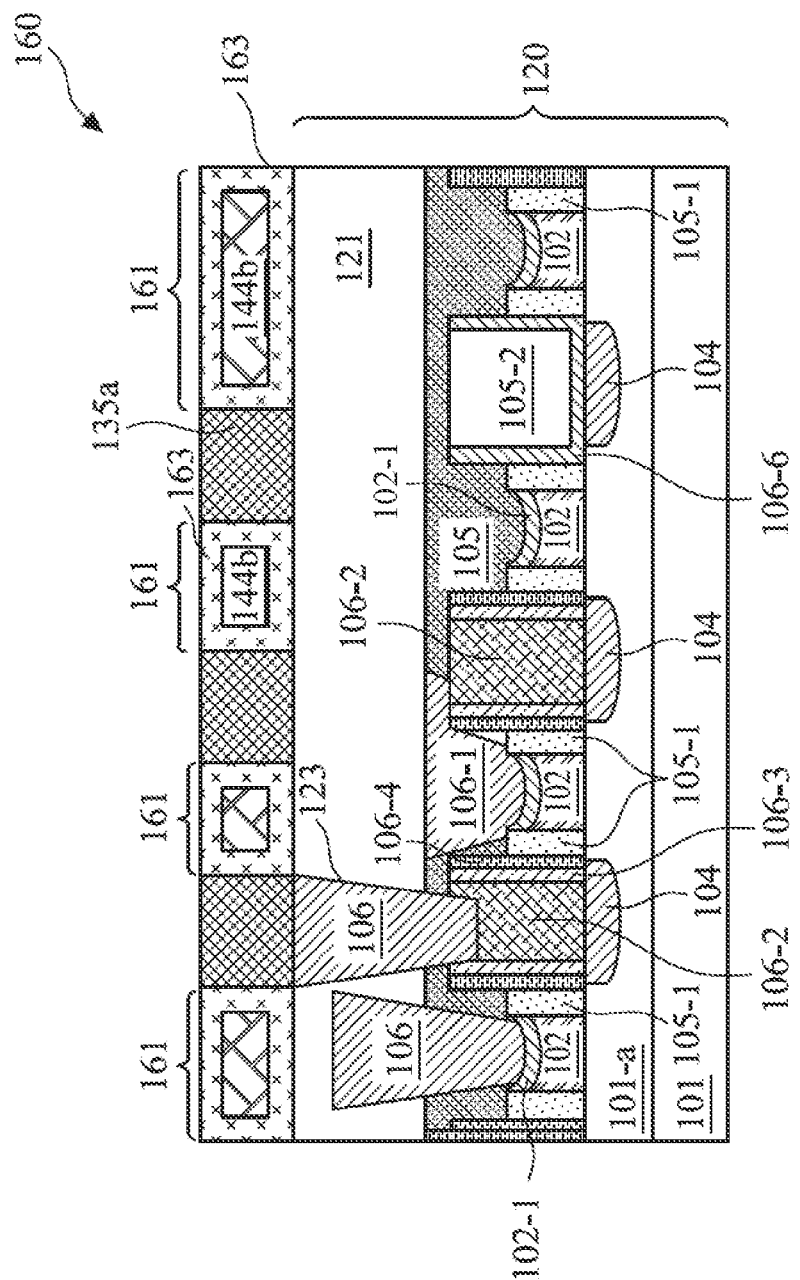

Next, as shown in FIG. 5J, a second planarization process is performed to form a second planarized structure 160 that includes the remaining portions 135a of the sacrificial layer and enclosed protective dielectric structures 161 formed by the low-k dielectric material 144b enclosed on all sides by a protective dielectric enclosure 163. The protective dielectric enclosure 163 is formed by portions of the first and second protective dielectric layers, 141 and 142, as described above. In some embodiments, the second planarization process is performed by CMP to polish off the excess second protective dielectric layer 142 so its top surface is coplanar with the sacrificial regions 135a, resulting in a device structure with sacrificial regions 135a separated by enclosed protective dielectric structures 161.

In process 470, method 400 includes replacing the remaining portions of the sacrificial layer with a target metal interconnect material to form a third planarized structure that includes the target metal interconnect material disposed between enclosed protective dielectric structures. Process 470 is illustrated in FIGS. 5K and 5L.

Figure 5K:
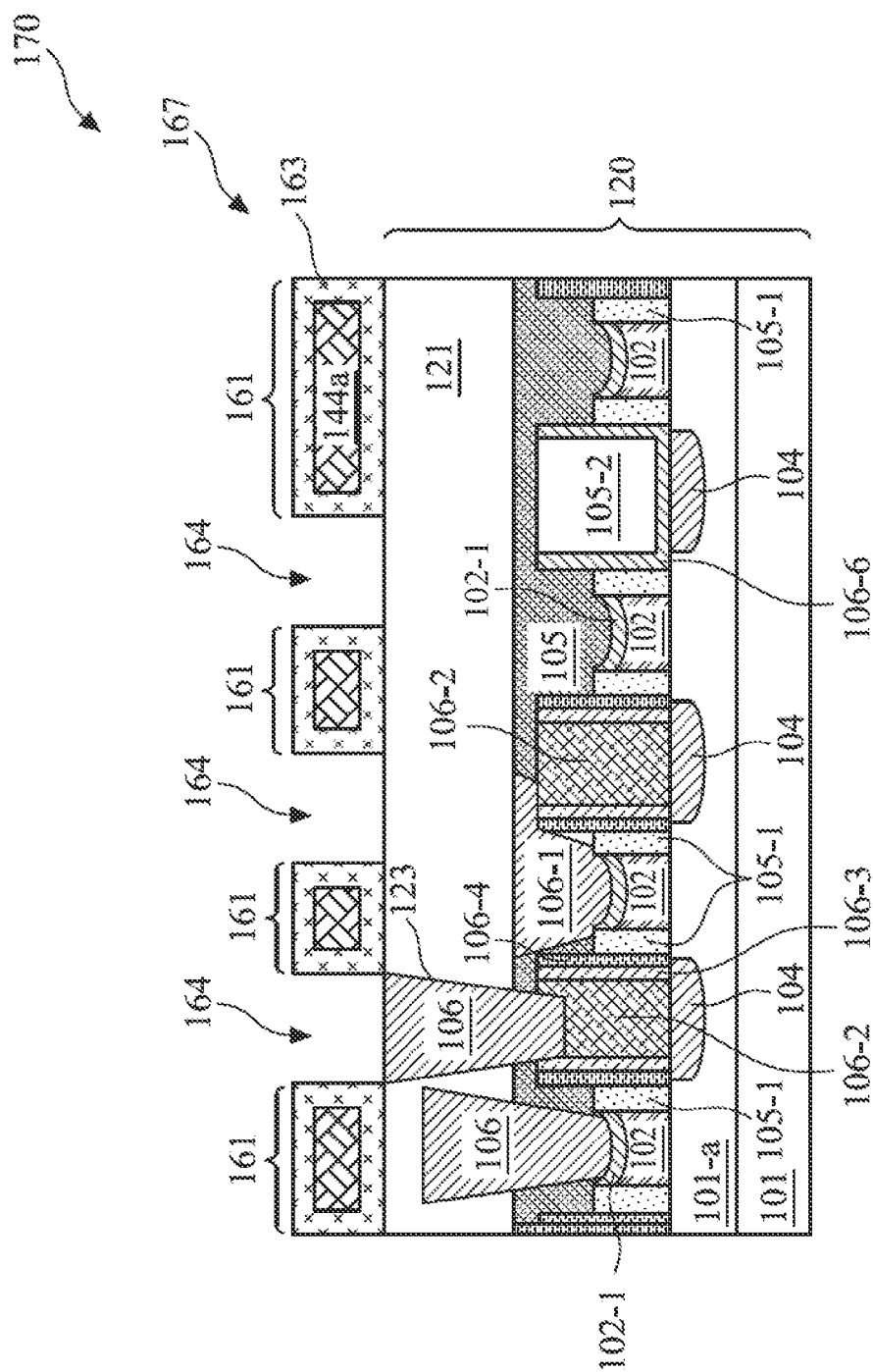

As shown in FIG. 5K, starting from the structure in FIG. 5J, the remaining portions 135a of the sacrificial layer are removed, leaving gap regions 164 disposed between the enclosed protective dielectric structures 161. FIG. 5K shows a patterned dielectric layer 167 including a plurality of enclosed protective dielectric structures 161 separated by gap regions 164. In some embodiments, the removal of the remaining portions 135a of the sacrificial layer is carried out by an etch process suitable for the material for the sacrificial layer, which can be Si, Ru, W, or Mo, etc., as described above.

Figure 5L:
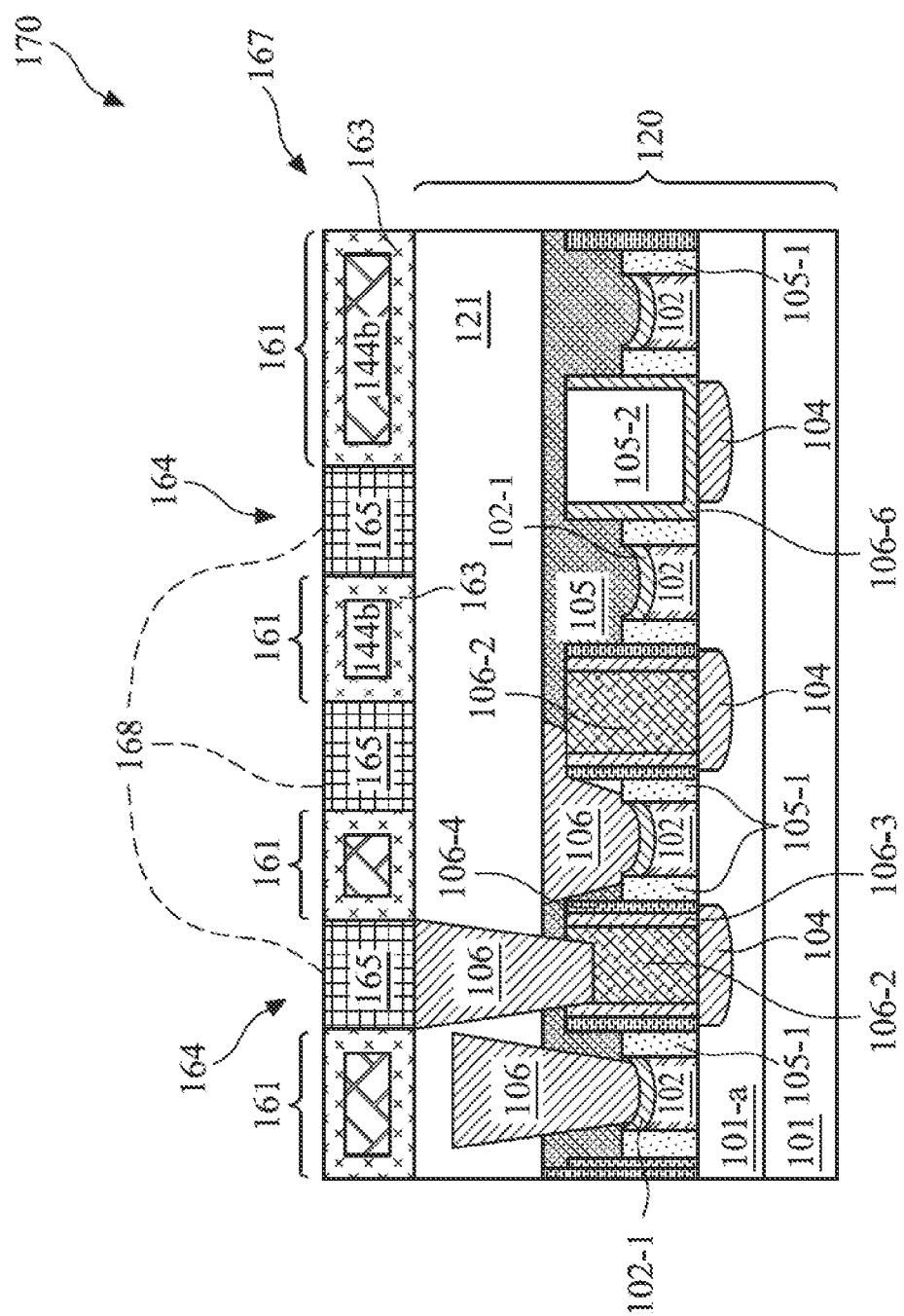

Next, as illustrated in FIG. 5L, a target metal interconnect material 165 is deposited in the gap regions 164 disposed between the enclosed protective dielectric structures 161. In this example, the target metal interconnect material 165 includes copper (Cu). In other examples, the target metal interconnect material 165 can be other suitable conductive materials, such as aluminum (Al). The conductive material employed to form the target metal interconnect material 165 may be formed in the gap regions 164 by various sputtering, evaporation, electroless-plating, electroplating and/or other deposition processes.

Subsequently, a third planarization process is performed to form a third planarized structure 170 that includes a patterned dielectric layer 167 including a plurality of enclosed protective dielectric structures 161 separated by gap regions 164. The third planarization process is performed using CMP. Each enclosed protective dielectric structure 161 includes a low-k dielectric material 144b enclosed by a protective dielectric enclosure 163. A metal interconnect structure 168 having metal interconnect material 165 disposed in the gap regions 164 between the enclosed protective dielectric structures 161 is shown in FIG. 5L.

In some embodiments, a copper interconnect structure is provided, in which no barrier metal layers are needed between the copper line and the adjacent low-k dielectric layer. Instead, a protective dielectric layer is formed between the copper line and the low-k dielectric. The protective dielectric layer is a low-k dielectric and also functions as a diffusion barrier for copper. The protective dielectric layer does not reduce the space reserved for the copper line, allowing the maximum width for the copper line for the lowest resistivity and the resistor-capacitor (RC) delay of interconnection lines. In some embodiments, the copper lines are separated by enclosed protective dielectric structures, which include a low-k dielectric material enclosed on all sides by a protective dielectric enclosure. The protective dielectric enclosure includes a layer of the protective dielectric layer, which is a low-k dielectric and a copper diffusion barrier. In this structure, the low-k dielectric is protected from etching damages, which are known to increase the dielectric constant of the low-k dielectric layer after an etching process.

Further, in some embodiments, a method is provided, in which a sacrificial structure is formed as a place holder for the final copper interconnect structure, and the low-k dielectric layer is formed around the sacrificial structure. Subsequently, the sacrificial structure is replaced by the copper interconnect. In this process, the low-k dielectric layer is not subject to energetic plasma or reactive-ion etching process, which can cause damage to the low-k dielectric. In contrast, in the conventional process, the low-k dielectric is subject to etching to form openings in which the copper material is deposited. The etching process is known to cause damage in the low-k dielectric layer. In addition, the method also provides higher metal line densities.

In some embodiments, a method for forming a semiconductor device includes providing a base device having a top dielectric layer, forming a sacrificial layer on the top dielectric layer, and patterning the sacrificial layer to form openings. The method also includes a depositing first protective dielectric layer and a low-K dielectric layer in the opening and performing planarization to form a first planarized structure including sacrificial regions and low k regions separated by a first protective layer. Next, top portions of the low-k dielectric layer are replaced with a second protective dielectric layer to form a second planarized structure that includes enclosed dielectric structures separated by sacrificial regions. The method further includes replacing the remaining portions of the sacrificial layer with a target metal interconnect material to form a third planarized structure that includes metal interconnect material disposed between enclosed dielectric structures.

According to some embodiments, a method of forming a semiconductor device includes providing a base device structure having a top dielectric layer and metal contact structures disposed in the top dielectric layer, forming a sacrificial layer on the top dielectric layer, and patterning the sacrificial layer to form patterned sacrificial regions and openings in the sacrificial layer. Each opening has sidewalls and a bottom surface. The method also includes depositing a first protective dielectric layer on the sidewalls and bottom surface of each opening, depositing a low-k dielectric material on the first protective dielectric layer, and performing a first planarization process to form a first planarized structure. The first planarized structure includes a lower portion of the sacrificial regions, a lower portion of the first protective dielectric layer lining the sidewalls and the bottom surface of the openings in the lower portion of the sacrificial layer, and a lower portion of the low-k dielectric material filling the openings. The method also includes replacing a top portion of the low-k dielectric material with a second protective dielectric layer to form second planarized structure that includes enclosed protective dielectric structures separated by sacrificial regions. The enclosed protective dielectric structures are formed by the low-k dielectric material enclosed on all sides by a protective dielectric enclosure formed by portions of the first and second protective dielectric layers. The method further includes replacing the sacrificial regions with a target metal interconnect material to form a third planarized structure that includes the target metal interconnect material disposed between enclosed protective dielectric structures.

According to some embodiments, a semiconductor device includes a base semiconductor structure having a top dielectric layer and one or more metal contact structures disposed in the top dielectric layer. The semiconductor device also includes a patterned dielectric layer on the top dielectric layer. The patterned dielectric layer includes a plurality of enclosed protective dielectric structures separated by gap regions. Each enclosed protective dielectric structure includes a low-k dielectric material enclosed on all sides by a protective dielectric enclosure. The semiconductor device also includes a metal interconnect structure having metal interconnect material disposed in the gap regions in the patterned dielectric layer and in contact with the enclosed protective dielectric structures.

According to some embodiments, a fin-type field effect transistor (FinFET) device includes a substrate having a fin structure, a gate structure across the fin structure, a source/drain (S/D) region in and/or on the fin structure and on a side of the gate structure. The FinFET device also has a top dielectric layer disposed on the substrate, metal contact structures disposed in the top dielectric layer and in contact with the gate structure and the source/drain (S/D) region, and a patterned dielectric layer on the top dielectric layer. The patterned dielectric layer includes a plurality of enclosed protective dielectric structures separated by gap regions. Each enclosed protective dielectric structure includes a low-k dielectric material enclosed on all sides by a protective dielectric enclosure. The FinFET device also includes a metal interconnect structure having metal interconnect material disposed in the gap regions in the patterned dielectric layer and in contact with enclosed protective dielectric structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   providing a base device structure having a top dielectric layer and metal contact structures disposed in the top dielectric layer;
   forming a sacrificial layer on the top dielectric layer;
   patterning the sacrificial layer to form sacrificial regions and openings in the sacrificial layer, each opening having sidewalls and a bottom surface;
   depositing a first protective dielectric layer on the sidewalls and bottom surface of each opening;
   depositing a low-k dielectric material on the first protective dielectric layer;
   performing a first planarization process to form a first planarized structure including:
   a lower portion of the sacrificial regions;
   a lower portion of the first protective dielectric layer lining the sidewalls and the bottom surface of the openings in a lower portion of the sacrificial layer; and
   a lower portion of the low-k dielectric material filling the openings;
   replacing a top portion of the low-k dielectric material with a second protective dielectric layer to form a second planarized structure that includes enclosed protective dielectric structures separated by the sacrificial regions, wherein the enclosed protective dielectric structures are formed by the low-k dielectric material enclosed on all sides of the low-k dielectric material by a protective dielectric enclosure formed by portions of the first and second protective dielectric layers; and
   replacing the sacrificial regions with a target metal interconnect material to form a third planarized structure that includes the target metal interconnect material disposed between the enclosed protective dielectric structures.

2. The method of claim 1, wherein the target metal interconnect material is in direct contact with the first and second protective dielectric layers without a barrier metal layer.

3. The method of claim 2, wherein the target metal interconnect material is in contact with the one or more of the metal contact structures and the top dielectric layer.

4. The method of claim 2, wherein the target metal interconnect material comprises copper (Cu), and the first and second protective dielectric layers comprise a boron nitride (BN) material.

5. The method of claim 4, wherein the boron nitride (BN) material comprises amorphous boron nitride (a-BN) or hexagonal boron nitride (h-BN).

6. The method of claim 1, wherein replacing the top portion of the low-k dielectric material with the second protective dielectric layer comprises:
   removing the top portion of the low-k dielectric material to form a recess, leaving the first protective dielectric layer lining the sidewalls of the openings in the lower portion of the sacrificial layer and remaining portions of the low-k dielectric material;
   depositing the second protective dielectric layer on the remaining portions of the low-k dielectric material in the openings; and
   performing a second planarization process to form the second planarized structure that includes the enclosed protective dielectric structures formed by the low-k dielectric material enclosed on all sides of the low-k dielectric material by the first and second protective dielectric layers and the sacrificial regions.

7. The method of claim 6, wherein replacing the sacrificial regions with the target metal interconnect material comprises:
   removing the sacrificial regions, leaving gap regions disposed between the enclosed protective dielectric structures;
   depositing the target metal interconnect material in the gap regions; and
   performing a third planarization process to form the third planarized structure that includes a metal interconnect structure having the target metal interconnect material disposed in the gap regions between the enclosed protective dielectric structures.

8. The method of claim 1, wherein the sacrificial layer comprises a bottom layer of silicon (Si), ruthenium (Ru), or tungsten (W), a titanium nitride (TiN) layer on the bottom layer, and a tetraethyl orthosilicate (TEOS) layer on the TiN layer.

9. The method of claim 8, wherein forming openings in the sacrificial layer comprises etching the sacrificial layer using a patterned silicon layer as a hard mask.

10. The method of claim 1, wherein the base device structure comprises a fin-type field effect transistor (FinFET), wherein the top dielectric layer is an interlayer dielectric layer disposed over the fin-type field effect transistor (FinFET).

11. A semiconductor structure, comprising:
   a base semiconductor structure having a top dielectric layer and one or more metal contact structures disposed in the top dielectric layer;
   a patterned dielectric layer on the top dielectric layer, the patterned dielectric layer including a plurality of enclosed protective dielectric structures separated by gap regions, each enclosed protective dielectric structure comprising:
      a low-k dielectric core comprising a low-k dielectric material; and
      a protective dielectric enclosure enclosing the low-k dielectric core on all sides of the low-k dielectric core; and
   a metal interconnect structure consisting of a metal interconnect material and disposed in the gap regions in the patterned dielectric layer and in contact with the enclosed protective dielectric structures, wherein a top surface of the metal interconnect structure is exposed and not covered by the protective dielectric enclosure.

12. The semiconductor structure of claim 11, wherein the metal interconnect structure is in direct contact with the protective dielectric enclosure without a barrier metal layer.

13. The semiconductor structure of claim 12, wherein the protective dielectric enclosure comprises a boron nitride (BN) material.

14. The semiconductor structure of claim 12, wherein the metal interconnect structure is in direct contact with the top dielectric layer and the one or more metal contact structures in the base semiconductor structure.

15. The semiconductor structure of claim 11, wherein the top surface of the metal interconnect structure is substantially coplanar with a top surface of the patterned dielectric layer.

16. A fin-type field effect transistor (FinFET) device, comprising:
   a substrate having a fin structure;
   a gate structure across the fin structure;
   a source/drain (S/D) region in and/or on the fin structure, and on a side of the gate structure;
   a top dielectric layer disposed on the substrate;
   metal contact structures disposed in the top dielectric layer and in contact with the gate structure and the source/drain (S/D) region; and
   a patterned dielectric layer on the top dielectric layer, the patterned dielectric layer including a plurality of enclosed protective dielectric structures separated by gap regions, each enclosed protective dielectric structure comprising:
      a low-k dielectric core comprising a low-k dielectric material; and
      a protective dielectric enclosure enclosing the low-k dielectric core on all sides of the low-k dielectric core; and
   a metal interconnect structure consisting of a metal interconnect material and disposed in the gap regions in the patterned dielectric layer and in contact with the enclosed protective dielectric structures, wherein a top surface of the metal interconnect structure is exposed and not covered by the protective dielectric enclosure.

17. The FinFET device of claim 16, wherein the metal interconnect structure is in direct contact with the protective dielectric enclosure without a barrier metal layer.

18. The FinFET device of claim 17, wherein the protective dielectric enclosure comprises a boron nitride (BN) material.

19. The FinFET device of claim 18, wherein the boron nitride (BN) material comprises amorphous boron nitride (a-BN) or hexagonal boron nitride (h-BN).

20. The FinFET device of claim 16, wherein the metal interconnect structure is in direct contact with the top dielectric layer and the metal contact structures.

* * * * *